US011953830B2

(12) United States Patent
Komori et al.

(10) Patent No.: US 11,953,830 B2
(45) Date of Patent: Apr. 9, 2024

(54) PHOTOSENSITIVE RESIN COMPOSITION, PHOTOSENSITIVE RESIN SHEET, CURED FILM, METHOD FOR PRODUCING CURED FILM, ORGANIC EL DISPLAY DEVICE AND ELECTRONIC COMPONENT

(71) Applicant: TORAY INDUSTRIES, INC., Tokyo (JP)

(72) Inventors: Yusuke Komori, Otsu (JP); Takashi Sumi, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 392 days.

(21) Appl. No.: 17/436,941

(22) PCT Filed: Mar. 4, 2020

(86) PCT No.: PCT/JP2020/009104
§ 371 (c)(1),
(2) Date: Sep. 7, 2021

(87) PCT Pub. No.: WO2020/184326
PCT Pub. Date: Sep. 17, 2020

(65) Prior Publication Data
US 2022/0155680 A1     May 19, 2022

(30) Foreign Application Priority Data

Mar. 14, 2019 (JP) .................................. 2019-046742

(51) Int. Cl.
*G03F 7/023*    (2006.01)
*G03F 7/40*     (2006.01)
(Continued)

(52) U.S. Cl.
CPC .............. *G03F 7/0233* (2013.01); *G03F 7/40* (2013.01); *H01L 23/5329* (2013.01); *H10K 59/122* (2023.02); *H10K 59/124* (2023.02)

(58) Field of Classification Search
CPC . H01L 23/5329; H01L 27/1248; H05B 33/22; H05B 33/10–145
See application file for complete search history.

(56) References Cited

U.S. PATENT DOCUMENTS

2019/0113845 A1   4/2019  Yorisue et al.
2021/0284839 A1   9/2021  Komori et al.

FOREIGN PATENT DOCUMENTS

JP    2011-197362 A    10/2011
JP    2015-4000 A       1/2015
(Continued)

OTHER PUBLICATIONS

International Search Report, issued in PCT/JP2020/009104, PCT/ISA/210, dated May 26, 2020.
(Continued)

*Primary Examiner* — Amar Movva
(74) *Attorney, Agent, or Firm* — Birch, Stewart, Kolasch & Birch, LLP

(57) ABSTRACT

The present invention addresses the problem of providing a photosensitive resin composition which exhibits good imidization rate even in cases where the photosensitive resin composition is fired at a temperature of 200° C. or less, while having high pattern processability, and a cured film of which exhibits high long-term reliability if used in an organic EL display device. In order to solve the above-described problem, a photosensitive resin composition according to the present invention contains (a) a polyimide precursor, (b) a phenolic compound having an electron-withdrawing group and (c) a photosensitive compound; and the polyimide precursor (a) has a residue which is derived (Continued)

from a diamine that has an ionization potential of less than 7.1 eV.

15 Claims, 4 Drawing Sheets

(51) Int. Cl.
*H01L 23/532* (2006.01)
*H10K 59/122* (2023.01)
*H10K 59/124* (2023.01)

(56) References Cited

FOREIGN PATENT DOCUMENTS

| TW | 201829539 A | 8/2018 |
|---|---|---|
| WO | WO 2017/170600 A1 | 10/2017 |
| WO | WO 2017/217292 A1 | 12/2017 |

OTHER PUBLICATIONS

Written Opinion of the International Searching Authority, issued in PCT/JP2020/009104, PCT/ISA/237, dated May 26, 2020.

[Fig 1]
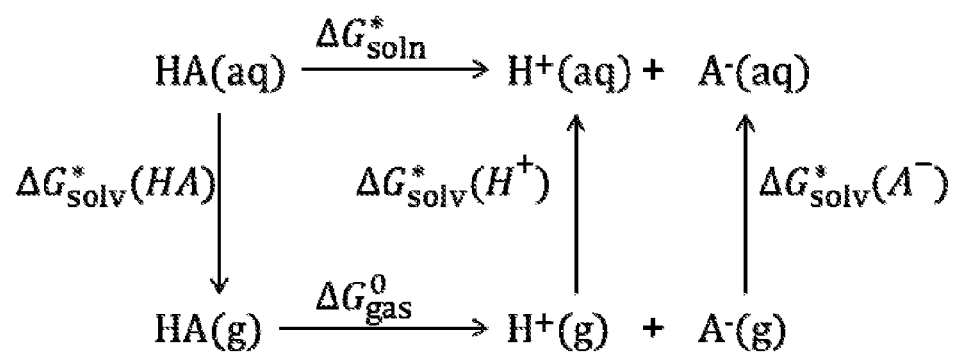
[Fig 2]
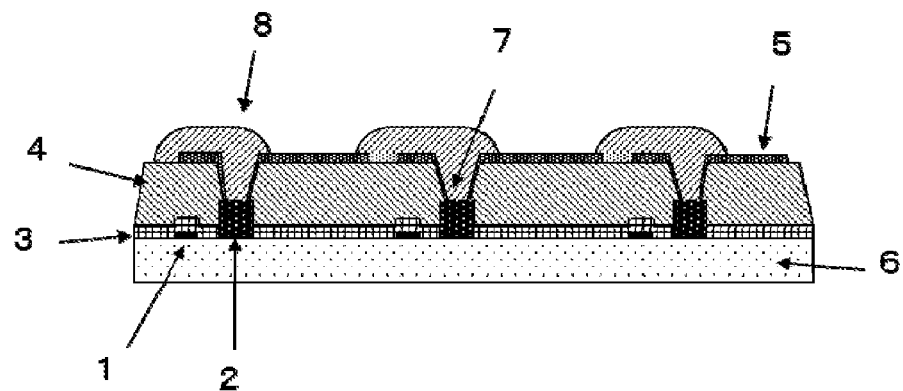

[Fig 3]
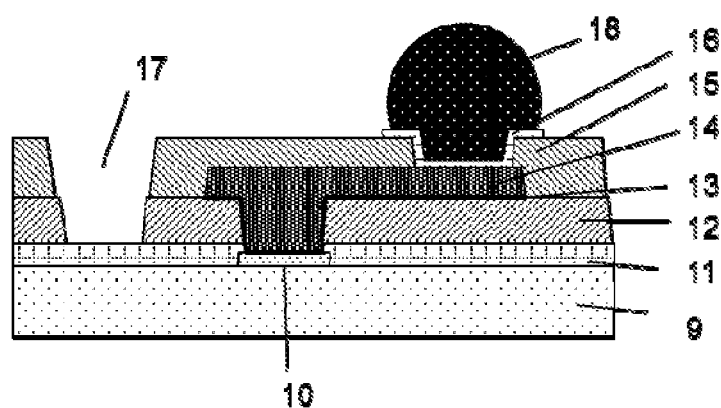

[Fig 4]
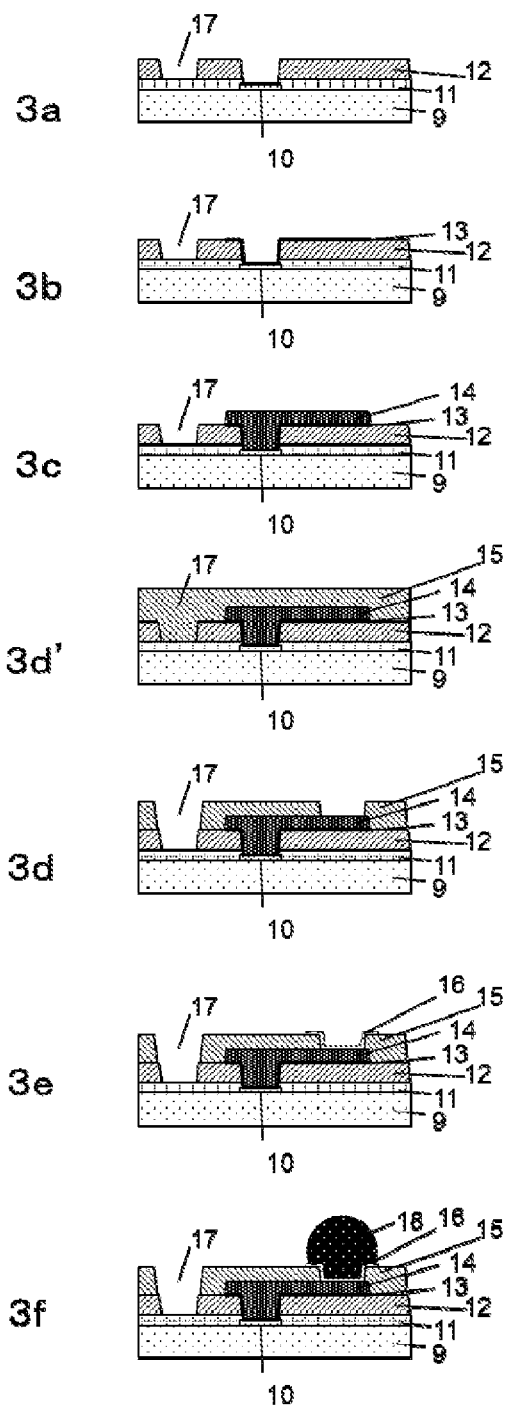

[Fig 5]
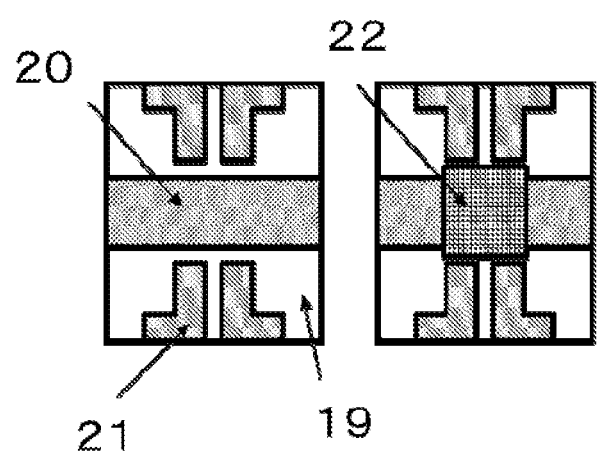
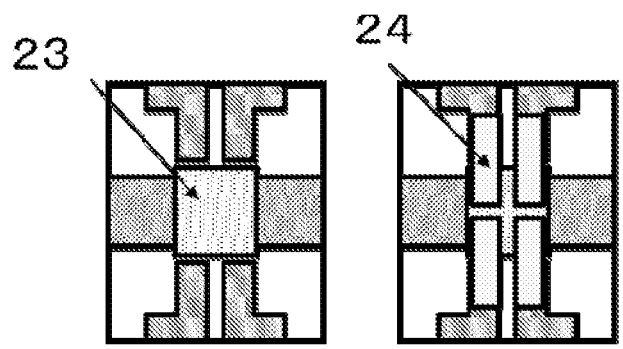

PHOTOSENSITIVE RESIN COMPOSITION, PHOTOSENSITIVE RESIN SHEET, CURED FILM, METHOD FOR PRODUCING CURED FILM, ORGANIC EL DISPLAY DEVICE AND ELECTRONIC COMPONENT

TECHNICAL FIELD

The present invention relates to a photosensitive resin composition that can be suitably used in layers such as a planarization layer and an insulation layer in an organic electroluminescence (EL) display apparatus and an interlayer insulation layer and a surface protective layer in an electronic component.

BACKGROUND ART

Organic electroluminescence (hereinafter referred to as organic EL) display apparatus has been used in display apparatus having a thin display, such as smartphones, tablet personal computers, and televisions, to develop many products. In general, an organic EL display apparatus has a drive circuit, a planarization layer, a first electrode, an insulation layer, a light-emitting layer, and a second electrode that are placed over a substrate. The organic EL display apparatus can emit light when a voltage is applied between the first electrode and the second electrode facing to each other. As a material for a planarization layer or an insulation layer among the above-described components, photosensitive resin compositions are generally used that can be patterned by ultraviolet irradiation. Among the photosensitive resin compositions, photosensitive resin compositions in which a polyimide-based resin is used can provide a highly reliable organic EL display apparatus because of high heat resistance of the resin and a small amount of gas components generated from the cured film, and therefore are suitably used.

Usually, a coating film of a precursor of a polyimide is thermally dehydrated and cyclized to obtain a thin film having excellent heat resistance and an excellent mechanical characteristic. In this case, high temperature firing at a temperature of 300° C. or higher is usually to be performed. However, for example, in the case of an organic EL display apparatus including a white organic light emitting diode (OLED) and a color filter, the color filter has low heat resistance, and therefore a low-temperature curing process is to be performed in a subsequent step. Furthermore, polyimides and polybenzoxazole are widely used as a surface protective layer, an interlayer insulation layer, and the like in a semiconductor device. However, for example, magnetoresistive random access memories (MRAMs) as a promising next-generation memory and sealing resins are easily affected at high temperature. Therefore, for use in an insulation layer, a planarization layer, and a protective layer of such a device, a polyimide resin has been awaited that has a good imidization rate even when cured through firing at a low temperature of 200° C. or lower and has a characteristic comparable to that of a conventional material fired at a high temperature of around 300° C.

As a technique for lowering the temperature in imidization, a negative-type photosensitive resin composition has been disclosed that includes a polyimide precursor having a weight average molecular weight of 3,000 or more and less than 16,000 and having a specific structure as a substituent of a carboxy group of a polyamic acid, and includes a photo initiator (see Patent Document 1). Furthermore, in addition to the already known technique in which a catalytic amount of p-toluenesulfonic acid as a strong acid is added to a polyamic acid solution, a technique has been also disclosed in which a catalytic amount of 1,4-diazabicyclo[2.2.2]octane and 1,8-diazabicyclo[5.4.0]-7-undecene as strong bases are added to a polyamic acid solution (see Non-Patent Document 1). As described above, a polyimide having a high imidization rate can be obtained at a temperature of 200° C. or lower with a method in which a strong acid or a strong base is used as an imidization accelerator.

PRIOR ART DOCUMENTS

Patent Documents

Patent Document 1: International Publication No. 2018/037997

Non-Patent Document

Non-Patent Document 1: M. Ueda et al. Chem. Lett, 33 (9), p. 1156-1157, 2004

SUMMARY OF THE INVENTION

Problems to be Solved by the Invention

However, as a result of examination by the applicant, it cannot be said that the imidization rate of a cured film obtained by firing the composition described in Patent Document 1 at 200° C. is sufficient. Furthermore, problems described below have been found in applying, to a photosensitive resin composition, the method in which a strong acid or the strong base described in Non-Patent Document 1 is used as an imidization accelerator. The photosensitive compound is decomposed by the imidization accelerator added, and imidization proceeds through heating in a step of drying a solvent (prebaking) of the photosensitive resin composition for formation of a photosensitive resin film, leading to deterioration of pattern processability. Therefore, a material is awaited in which imidization does not proceed at the time of prebaking, and proceeds well in a step of firing the patterned photosensitive resin film.

The demand for high reliability of organic EL display apparatus has become severer year by year, and materials for a planarization layer and materials for an insulation layer are to maintain a high physical property of the film even after a reliability test under an acceleration condition such as high temperature, high humidity, or light irradiation. Thus, a material has been awaited that can obtain a characteristic comparable to that obtained by firing at a high temperature, even in a case where the material is fired at a low temperature.

Therefore, an object of the present invention is to provide a photosensitive resin composition having a good imidization rate even when fired at a temperature of 200° C. or lower, high pattern processability, and high long-term reliability when the cured film is used in an organic EL display apparatus.

Solutions to the Problems

In order to solve the above-described problems, the photosensitive resin composition of the present invention includes a polyimide precursor (a), a phenol compound (b) having an electron withdrawing group, and a photosensitive compound (c), and the polyimide precursor (a) has a residue derived from a diamine having an ionization potential of less than 7.1 eV.

Effects of the Invention

The photosensitive resin composition of the present invention has a good imidization rate even when fired at a temperature of 200° C. or lower, high pattern processability, and high long-term reliability when the cured film is used in an organic EL display apparatus.

BRIEF DESCRIPTION OF THE DRAWINGS

FIG. 1 shows a reaction scheme of a dissociation reaction of an acid (proton).

FIG. 2 is a sectional view of an example of a thin film transistor (TFT) substrate.

FIG. 3 is an enlarged sectional view of an example of a pad portion of a semiconductor equipment having a bump.

FIG. 4 is a schematic view showing an example of a method for producing a semiconductor equipment having a bump.

FIG. 5 is a schematic view of a procedure for preparation of an organic EL display apparatus in Examples.

EMBODIMENTS OF THE INVENTION

Embodiments of the present invention will be described in detail.

The photosensitive resin composition of the present invention includes a polyimide precursor (a), a phenol compound (b) having an electron withdrawing group, and a photosensitive compound (c), and the polyimide precursor (a) has a residue derived from a diamine having an ionization potential of less than 7.1 eV.

<Polyimide Precursor (a)>

The photosensitive resin composition of the present invention includes the polyimide precursor (a). The polyimide precursor (a) has the residue derived from the diamine having an ionization potential of less than 7.1 eV. By the fact that the polyimide precursor (a) and the phenol compound (b) having an electron withdrawing group described below are included, a cured film having a high imidization rate can be obtained even in a case where firing is performed at a temperature of 200° C. or lower. Furthermore, when the cured film of the present invention described below is used as a planarization layer and/or an insulation layer in an organic EL display apparatus, the long-term reliability can be improved. The term "polyimide precursor" refers to a resin that is converted into a polyimide by heat treatment or chemical treatment. Examples of the polyimide precursor include a polyamic acid and a polyamic acid ester.

In the present invention, the polyimide precursor preferably has alkali solubility. The term "alkali solubility" in the present invention refers to a property such that the dissolution rate determined in the following manner is 50 nm/min or more. A solution of the polyimide precursor (a) dissolved in γ-butyrolactone is applied to a silicon wafer, the resulting product is prebaked at 120° C. for 4 minutes to form a prebaked film having a film thickness of 10 μm±0.5 μm, the prebaked film is immersed in a 2.38% by mass tetramethylammonium hydroxide aqueous solution at 23±1° C. for 1 minute and then subjected to rinse treatment with pure water, and the dissolution rate is determined from the decrease in the film thickness.

The polyimide precursor (a) in the present invention preferably has a hydroxyl group and/or an acidic group in the structural unit and/or at the main chain terminal of the polyimide precursor (a) for impartation of alkali solubility. Examples of the acidic group include a carboxy group, a phenolic hydroxyl group, and a sulfonic acid group.

The polyimide precursor (a) preferably has a fluorine atom. If the polyimide precursor (a) has a fluorine atom, water repellency can be imparted to the cured film.

The polyimide precursor (a) in the present invention preferably has a structural unit represented by General Formula (3) shown below.

[Chem. 1]

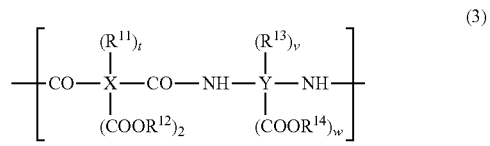

In General Formula (3), X represents a tetravalent to heptavalent organic group, and Y represents a divalent to undecavalent organic group. $R^{11}$ and $R^{13}$ each independently represent a hydroxyl group or a sulfonic acid group, and each of $R^{11}$ and $R^{13}$ may be a single group or a different group by the structural unit. $R^{12}$ and $R^{14}$ each independently represent a hydrogen atom or a monovalent hydrocarbon group having 1 to 20 carbon atoms. t and w each independently represent an integer of 0 to 3, and v represents an integer of 0 to 6.

The polyimide precursor (a) preferably has 5 to 100,000 structural units represented by General Formula (3). The polyimide precursor (a) may have another structural unit in addition to the structural unit represented by General Formula (3). In this case, the polyimide precursor (a) preferably has the structural unit represented by General Formula (3) in an amount of 50 mol % or more based on 100 mol % of the total structural units.

In General Formula (3), $X(R^{11})_t(COOR^{12})_2$ represents a residue of an acid. X is a tetravalent to heptavalent organic group, and preferably an organic group containing an aromatic ring or a cyclic aliphatic group and having 5 to 40 carbon atoms.

Examples of the acid include aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenone tetracarboxylic acid, 2,2',3,3'-benzophenone tetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, and aromatic tetracarboxylic acids having the structure shown below, aliphatic tetracarboxylic acids such as butanetetracarboxylic acid, and tetracarboxylic acids such as aliphatic tetracarboxylic acids, such as 1,2,3,4-cyclopentane tetracarboxylic acid, containing a cyclic aliphatic group. Two or more of these acids may be used.

[Chem. 2]

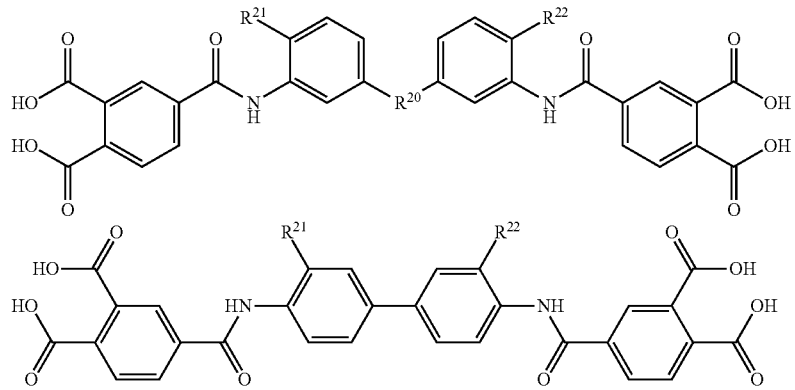

$R^{20}$ represents an oxygen atom, $C(CF_3)_2$, or $C(CH_3)_2$. $R^{21}$ and $R^{22}$ each independently represent a hydrogen atom or a hydroxyl group.

In the case of a tetracarboxylic acid among the above-described acids, two carboxy groups correspond to $(COOR^{12})_2$ in General Formula (3).

These acids may be used as they are, or may be used in a form of an anhydride, an active ester, or an active amide. Examples of the active ester include N-hydroxysuccinimide ester compounds obtained by reacting a carboxyl group of the acid with N-hydroxysuccinimide, and examples of the active amide include N-acylimidazole compounds obtained by reacting a carboxyl group of the acid with N,N'-carbonyldiimidazole.

Specific examples of the dianhydride include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenone tetracarboxylic dianhydride, 2,2',3,3'-benzophenone tetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)ether dianhydride, 1,2,5,6-naphthalenetetracarboxylic dianhydride, 9,9-bis(3,4-dicarboxyphenyl)fluorenic dianhydride, 9,9-bis{4-(3,4-dicarboxyphenoxy)phenyl}fluorenic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, and dianhydrides having the structure shown below, aliphatic tetracarboxylic dianhydrides such as butanetetracarboxylic dianhydride, and aliphatic tetracarboxylic dianhydrides containing a cyclic aliphatic group, such as 1,2,3,4-cyclopentanetetracarboxylic dianhydride. Two or more of these dianhydrides may be used.

[Chem. 3]

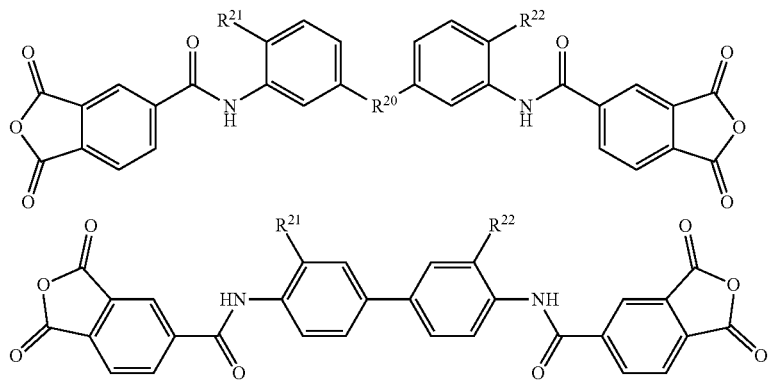

$R^{20}$ represents an oxygen atom, $C(CF_3)_2$, or $C(CH_3)_2$. $R^{21}$ and $R^{22}$ each independently represent a hydrogen atom or a hydroxyl group.

$Y(R^{13})_v(COOR^{14})_w$ in General Formula (3) represents the residue of the diamine. Y is a divalent to undecavalent organic group. The polyimide precursor (a) in the present invention has the residue derived from the diamine having an ionization potential (hereinafter, sometimes referred to as IP) of less than 7.1 eV.

In the present invention, the mechanism is not clear by which a cured film exhibiting a high imidization rate can be obtained by using the polyimide precursor (a) having the residue derived from the diamine having an ionization potential of less than 7.1 eV even in a case where firing is performed at a temperature of 200° C. or lower, but for example, the mechanism can be estimated as follows. That is, the imidization reaction of the polyimide precursor (a) proceeds by nucleophilic attack of the nitrogen atom of the residue derived from the diamine to the carbonyl carbon of the residue derived from the dianhydride. A polyimide precursor having a low ionization potential, that is, having a residue derived from an electron-rich diamine has a nitrogen atom having high nucleophilic power. Therefore, it can be estimated that the reactivity of the imidization reaction is high, and a cured film having a high imidization rate can be obtained even at a temperature of 200° C. or lower.

Examples of the diamine having an ionization potential of less than 7.1 eV include 2,7-diaminofluorene (Ip 6.48 eV, literature value), o-tolidine (Ip 6.58 eV, literature value), benzidine (Ip 6.73 eV, literature value), 4,4'-diaminodiphenyl ether (Ip 6.78 eV, literature value), 1,4-bis(4-aminophenoxy)benzene (Ip 6.80 eV, literature value), 2,2-bis[4-(4-aminophenoxy)phenyl]propane (Ip 6.84 eV, calculated value), 9,9-bis(4-aminophenyl)fluorene (Ip 6.88 eV, literature value), 4,4'-diaminodiphenylmethane (Ip 6.94 eV, literature value), p-phenylenediamine (Ip 7.03 eV, literature value), 3,3'-diaminodiphenylmethane (Ip 7.08 eV, literature value), m-tolidine (Ip 7.08 eV, literature value), and 1,3-bis(4-aminophenoxy)benzene (Ip 7.08 eV, calculated value). Two or more of these diamines may be used.

From the viewpoint of facilitating achievement of a high imidization rate even in a case where firing is performed at a temperature of 200° C. or lower, the ionization potential is preferably less than 7.0 eV, more preferably 6.9 eV, and still more preferably 6.8 eV. The lower limit of the ionization potential is not particularly limited, and is about 6.0 eV.

From the viewpoint of improving the sensitivity, the residue derived from the diamine having an ionization potential of less than 7.1 eV preferably has an ether bond. The diamine having an ionization potential of less than 7.1 eV preferably includes one or more diamines selected from the group consisting of 4,4'-diaminodiphenyl ether (Ip 6.78 eV, literature value), 1,4-bis(4-aminophenoxy)benzene (Ip 6.80 eV, literature value), 2,2-bis[4-(4-aminophenoxy)phenyl]propane (Ip 6.84 eV, calculated value), and 1,3-bis(4-aminophenoxy)benzene (Ip 7.08 eV, calculated value) among the above-described diamines.

As the value of Ip in the present invention, the literature value described in "Revised Edition, Latest Polyimides" (Shinji Ando, p. 102) was used. In the case of a diamine whose Ip is not described in the literature, the value was used that was determined similarly to the literature value by calculation (calculated value) with Gaussian 09 using B3LYP as the functional and using 6-311G (d) (structural optimization calculation) and 6-311++G(d,p) (energy calculation) as the basis set.

The polyimide precursor (a) used in the present invention may contain a residue of a diamine having an ionization potential of 7.1 eV or more in addition to the residue of the diamine having an ionization potential of less than 7.1 eV as long as the above-described characteristics are not impaired. In the case of containing a residue of a diamine having an ionization potential of 7.1 eV or more, the residue derived from the diamine having an ionization potential of less than 7.1 eV is preferably included at a content of 5 mol % or more, more preferably 10 mol % or more, and still more preferably 20 mol % or more based on 100 mol % of diamine residues included in the polyimide precursor (a), from the viewpoint of facilitating achievement of a high imidization rate even in a case where firing is performed at a temperature of 200° C. or lower. From the viewpoint of further improving the sensitivity, the content is preferably 50 mol % or less, and more preferably 40 mol % or less.

Examples of the diamine having an ionization potential of 7.1 eV or more include aromatic diamines such as 3,3'-diaminodiphenyl ether (Ip 7.12 eV, literature value), 2,2-bis[4-(4-aminophenoxy)phenyl]hexafluoropropane (Ip 7.15 eV, calculated value), 1,3-bis(3-aminophenoxy)benzene (Ip 7.18 eV, literature value), 9,9-bis(3-amino-4-hydroxyphenyl)fluorene (Ip 7.28 eV, calculated value), 3,3'-bis(trifluoromethyl)benzidine (Ip 7.30 eV, literature value), 2,2-bis(3-amino-4-methylphenyl)hexafluoropropane (Ip 7.32 eV, calculated value), m-phenylenediamine (Ip 7.39 eV, literature value), 2,2-bis(4-aminophenyl) hexafluoropropane (Ip 7.41 eV, calculated value), 4,4'-diaminodiphenyl sulfone (Ip 7.50 eV, literature value), 2,2'-bis(trifluoromethyl)benzidine (Ip 7.55 eV, literature value), 3,3'-diaminodiphenyl sulfone (Ip 7.68 eV, literature value), 2,2-bis(3-amino-4-hydroxyphenyl) hexafluoropropane (Ip 7.88 eV, calculated value), bis(3-amino-4-hydroxyphenyl)sulfone (Ip 8.02 eV, calculated value), and compounds obtained by substituting at least a part of hydrogen atoms of the aromatic ring of the above-described diamines with an alkyl group or a halogen atom, aliphatic diamines containing a cyclic aliphatic group, such as 4,4'-diaminodicyclohexylmethane (Ip 8.15 eV, literature value) and 1,4-cyclohexanediamine (Ip 8.61 eV, literature value), silicon atom-containing diamines such as 1,3-bis(3-aminopropyl)tetramethyldisiloxane (Ip 8.03 eV, calculated value), and a diamine having a structure shown below (Ip 7.16 eV, calculated value). Two or more of these diamines may be used.

[Chem. 4]

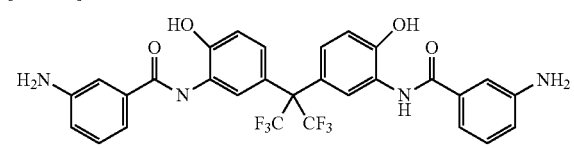

These diamines may be used as they are, or may be used, for example, in a form of a diisocyanate compound obtained by reacting an amino group of the diamine with phosgene, or in a form of a trimethylsilylated diamine obtained by reacting an amino group of the diamine with chlorotrimethylsilane.

Furthermore, by blocking the terminal of these resins with a monoamine having an acidic group, with an anhydride, with an acid chloride, with a monocarboxylic acid, or with an active ester compound, a resin having an acidic group at the main chain terminal can be obtained.

Preferable examples of the monoamine having an acidic group include 2-aminobenzoic acid, 3-aminobenzoic acid, 4-aminobenzoic acid, 4-aminosalicylic acid, 5-aminosalicylic acid, 6-aminosalicylic acid, 3-amino-4,6-dihydroxypyrimidine, 2-aminophenol, 3-aminophenol, 4-aminophenol, 2-aminothiophenol, 3-aminothiophenol, and 4-aminothiophenol. Two or more of these monoamines may be used.

Preferable examples of the anhydride include phthalic anhydride, maleic anhydride, nadic anhydride, cyclohexanedicarboxylic anhydride, and 3-hydroxyphthalic anhydride. Two or more of these anhydrides may be used.

Preferable examples of the monocarboxylic acid include 3-carboxyphenol, 4-carboxyphenol, 3-carboxythiophenol, and 4-carboxythiophenol. Two or more of these monocarboxylic acids may be used.

Preferable examples of the acid chloride include monoacid chloride compounds in which the carboxy group of the monocarboxylic acid is converted into an acid chloride, and monoacid chloride compounds in which only one carboxy group of a dicarboxylic acid such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, or 2,6-dicarboxynaphthalene is converted into an acid chloride. Two or more of these acid chlorides may be used.

Preferable examples of the active ester compound include reaction products of the monoacid chloride compound with N-hydroxybenzotriazole or N-hydroxy-5-norbornene-2,3-dicarboximide. Two or more of these active ester compounds may be used.

The polyimide precursor (a) in the present invention can be synthesized with a known method.

Examples of the method of producing a polyamic acid as a polyimide precursor include a method in which tetracarboxylic dianhydride and a diamine compound are reacted in a solvent at a low temperature.

Examples of the method of producing a polyamic acid ester as a polyimide precursor like a polyamic acid include, in addition to the above-described method in which a polyamic acid is reacted with an esterifying agent, a method in which a diester is obtained from tetracarboxylic dianhydride and an alcohol, and then the diester is reacted with an amine in a solvent in the presence of a condensing agent, and a method in which a diester is obtained from tetracarboxylic dianhydride and an alcohol, then the remaining dicarboxylic acid is converted into an acid chloride, and the acid chloride is reacted with an amine in a solvent. From the viewpoint of ease of synthesis, a step of reacting a polyamic acid with an esterifying agent is preferably included. The esterifying agent is not particularly limited, and a known method can be applied, but N,N-dimethylformamide dialkyl acetal is preferable because the obtained resin is easily purified.

The polymerization solvent is not particularly limited, and examples thereof include alkylene glycol monoalkyl ethers such as ethylene glycol monomethyl ether and propylene glycol monomethyl ether, alkyl acetates such as propyl acetate, butyl acetate, and isobutyl acetate, ketones such as methyl isobutyl ketone and methyl propyl ketone, alcohols such as butyl alcohol and isobutyl alcohol, ethyl lactate, butyl lactate, dipropylene glycol dimethyl ether, diethylene glycol dimethyl ether, diethylene glycol ethyl methyl ether, diethylene glycol diethyl ether, 3-methoxybutyl acetate, ethylene glycol monoethyl ether acetate, gamma butyrolactone, N-methyl-2-pyrrolidone, diacetone alcohol, N-cyclohexyl-2-pyrrolidone, N,N-dimethylformamide, N,N-dimethylacetamide, dimethyl sulfoxide, propylene glycol monomethyl ether acetate, N,N-dimethylisobutyramide, 3-methoxy-N,N-dimethylpropionamide, 3-butoxy-N,N-dimethylpropionamide, 1,3-dimethyl-2-imidazolidinone, N,N-dimethylpropyleneurea, delta valerolactone, 2-phenoxyethanol, 2-pyrrolidone, 2-methyl-1,3-propanediol, diethylene glycol butyl ether, triacetin, butyl benzoate, cyclohexylbenzene, bicyclohexyl, o-nitroanisole, diethylene glycol monobutyl ether, triethylene glycol monomethyl ether, N-(2-hydroxyethyl)-2-pyrrolidone, N,N-dimethylpropanamide, N,N-dimethylisobutyramide, N,N,N',N'-tetramethylurea, and 3-methyl-2-oxazolidinone.

<Phenol Compound (b) Having Electron Withdrawing Group>

The photosensitive resin composition of the present invention includes the phenol compound (b) having an electron withdrawing group (hereinafter, sometimes simply referred to as phenol compound (b)). By the fact that the polyimide precursor (a) and the phenol compound (b) are included, a cured film having a high imidization rate can be obtained even in a case where firing is performed at a temperature of 200° C. or lower, and furthermore, the long-term reliability can be improved when the cured film of the present invention described below is used as a planarization layer and/or an insulation layer in an organic EL display apparatus.

The term "electron withdrawing group" refers to a substituent having a Hammett substituent constant $\sigma_p^0$ defined in Kagaku Binran (Handbook of Chemistry) Kiso-Hen (Basic Ed.) Revised 5th Edition, 11-379 to 11-380 (edited by The Chemical Society of Japan, published by Maruzen Co., Ltd.) of a positive value. The phenol compound (b) having an electron withdrawing group has a phenolic hydroxyl group having high acidity due to the electron withdrawing group in the molecule, and therefore acts as an acid catalyst to promote imidization of the polyimide precursor (a).

Specific examples of the electron withdrawing group include a sulfonyl group, a sulfonic acid group, a sulfonic acid ester group, a sulfonic acid amide group, a sulfonic acid imide group, a carboxyl group, a carbonyl group, a carboxylic acid ester group, a cyano group, a halogen group, a trifluoromethyl group, and a nitro group, but are not limited thereto, and any known electron withdrawing group may be used. Among the groups, a carbonyl group, a trifluoromethyl group, a halogen group, and a sulfonyl group are preferable, and a trifluoromethyl group and a sulfonyl group are particularly preferable from the viewpoint of further promoting the imidization of the polyimide precursor (a).

In a preferable embodiment of the phenol compound (b), the phenol compound (b) preferably includes a compound (b1) having a phenolic hydroxyl group having an acid dissociation constant (pKa), determined by quantum chemical calculation using density functional theory method, of 11.0 or less. In the compound (b1) having a phenolic hydroxyl group having a pKa of 11.0 or less, the phenolic hydroxyl group has an acidity higher than that of unsubstituted phenol determined by the calculation (pKa=12.2). However, the acidity is not as high as that of a sulfonic acid compound (pKa<0) known as an imidization accelerator. Therefore, imidization is not promoted in a step of drying a solvent (prebaking) of the photosensitive resin composition described below, and the effect of promoting imidization in a step of firing the patterned photosensitive resin film can be enhanced. The lower limit of the pKa is not particularly limited, and is about 1.0.

The acid dissociation constant (pKa) is a logarithmic value of the reciprocal of an acid dissociation constant, and in the case of multistage dissociation, the first-stage dissociation constant (that is, pKa 1) is used. As the acid dissociation constant (pKa) in the present invention, an acid dissociation constant calculated through quantum chemical calculation using density functional theory method (DFT method) is used. In such quantum chemical calculation, the value is used that is determined by calculation by a computer with Gaussian 09 using B3LYP as the functional and using 6-311G (d) (structural optimization calculation) and 6-311++G(d,p) (energy calculation and vibration analysis) as the basis set. Furthermore, in such quantum chemical calculation, the thermodynamic quantity is calculated that is shown, in FIG. 1, in the reaction scheme of the acid dissociation reaction (proton dissociation reaction) of the acid (the acid represented by the formula: HA). In FIG. 1, HA represents an acid, A⁻ represents the acid ion, and H⁺ represents a hydrogen ion (proton). In FIG. 1, the formula:

HA (aq)→H$^+$ (aq)+A$^-$ (aq) represents a proton dissociation reaction in water, and the formula: HA (g)→H$^+$ (g)+A$^-$ (g) represents a proton dissociation reaction in a gas phase.

First, the Gibbs free energy of HA in the gas phase $G^0_{gas}$(HA) is determined using Gaussian 09, and then the difference between the Gibbs free energy of HA in the gas phase and that in water $\Delta G^*_{solv}$ (HA) is calculated using the SMD solvation model. In the SMD solvation model, the molecular cavity is set to be RADII=UAHF. Similarly, the Gibbs free energy of A$^-$ in the gas phase $G^0_{gas}$ (A$^-$) is determined, and then the difference between the Gibbs free energy of A$^-$ in the gas phase and that in water $\Delta G^*_{solv}$ (A$^-$) is calculated. Next, the pKa is calculated in accordance with the formulae (1) to (4) using the obtained values. In this calculation, the Gibbs free energy of H$^+$ $G^0_{gas}$ (H$^+$) is –6.275 kcal/mol, the difference between the Gibbs free energy of H$^+$ in the gas phase and that in water $\Delta G^*_{solv}$ (H$^+$) is –1,112.5 kJ/mol, the gas constant (R) is 8.314 J/(K·mol)=0.0821 atm·L/(K·mol), and the absolute temperature (T) is 298.15 K.

[Mathematical 1]

$$\Delta G^0_{gas} = G^0_{gas}(H^+) + G^0_{gas}(A^-) - G^0_{gas}(HA) \quad (1)$$

$$\Delta G^*_{gas} = G^0_{gas} + RT\ln\left(\frac{R[L\ \text{atm}\ K^{-1}\text{mol}^{-1}]T[K][\text{mol}]}{[L][\text{atm}]}\right) \quad (2)$$

$$\Delta G^*_{soln} = \Delta G^*_{gas} + \Delta G^*_{solv}(H^+) + \Delta G^*_{solv}(A^-) - \Delta G^*_{solv}(HA) \quad (3)$$

$$pKa = \frac{\Delta G^*_{soln}}{RT\ln(10)} \quad (4)$$

Specific examples of the compound (b1) having a phenolic hydroxyl group having a pKa of 11.0 or less include bisphenol S (pKa=9.8), bisphenol AF (pKa=10.8), and 4-(trifluoromethyl)phenol (pKa=10.5).

In another preferable embodiment of the phenol compound (b), the phenol compound (b) preferably includes a compound (b2) represented by General Formula (1).

[Chem. 5]

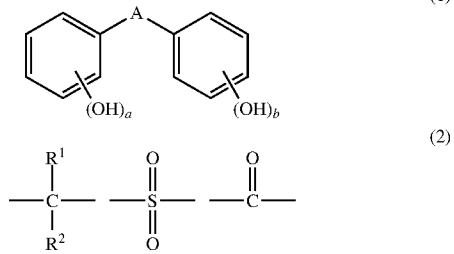

(1)

(2)

In General Formula (1), A represents a divalent group selected from the group consisting of structures represented by General Formula (2), a and b each independently represent an integer of 0 to 3, and a+b is an integer of 2 to 4. In General Formula (2), R$^1$ and R$^2$ each independently represent a halogen atom or a monovalent organic group having 1 to 20 carbon atoms and being substituted with a halogen atom.

The fact that the compound (b2) represented by General Formula (1) has high heat resistance and two or more phenolic hydroxyl groups leads to enhancement of the effect of improving the long-term reliability when the cured film of the present invention described below is used as a planarization layer and/or an insulation layer in an organic EL display apparatus.

Specific examples of the compound represented by General Formula (1) include bisphenol S (pKa=9.8), bisphenol AF (pKa=10.8), and 4,4'-dihydroxybenzophenone (pKa=11.3).

The phenol compound (b) is preferably included at a content of 1 part by mass or more, more preferably 5 parts by mass or more, and still more preferably 10 parts by mass or more based on 100 parts by mass of the polyimide precursor (a). Within such a range, a high imidization rate is easily achieved even in a case where firing is performed at a temperature of 200° C. or lower. The phenol compound (b) is preferably included at a content of 50 parts by mass or less, more preferably 40 parts by mass or less, and still more preferably 30 parts by mass or less. Within such a range, deterioration of the residual film rate can be easily suppressed after alkali development.

<Photosensitive Compound (c)>

The photosensitive resin composition of the present invention includes the photosensitive compound (c). Examples of the photosensitive compound (c) include a photo acid generator (c1) and a photo initiator (c2). The photo acid generator (c1) is a compound that generates an acid when irradiated with light, and the photo initiator (c2) is a compound that generates a radical by bond cleavage and/or reaction when exposed.

By the fact that the photo acid generator (c1) is included, a positive relief pattern can be obtained in which the part irradiated with light is dissolved because an acid is generated in the part irradiated with light to increase the solubility of the part in an alkali aqueous solution. Furthermore, by the fact that the photo acid generator (c1) and an epoxy compound or a thermal crosslinking agent described below are included, a negative relief pattern can be obtained in which the part irradiated with light is insolubilized because the acid generated in the part irradiated with light promotes the crosslinking reaction of the epoxy compound or the thermal crosslinking agent. By the fact that the photo initiator (c2) and a radically polymerizable compound described below are included, a negative relief pattern can be obtained in which the part irradiated with light is insolubilized because radical polymerization proceeds in the part irradiated with light.

Examples of the photo acid generator (c1) include quinone diazide compounds, sulfonium salts, phosphonium salts, diazonium salts, and iodonium salts. Two or more photo acid generators are preferably included. If two or more photo acid generators are included, a photosensitive resin composition having further high sensitivity can be obtained. From the viewpoint of the long-term reliability when the cured film of the present invention described below is used as a planarization layer and/or an insulation layer in an organic EL display apparatus, the photo acid generator (c1) is particularly preferably a quinone diazide compound.

Examples of the quinone diazide compound include compounds in which a sulfonic acid of quinonediazide is bonded to a polyhydroxy compound to form an ester, compounds in which a sulfonic acid of quinonediazide is sulfonamide-bonded to a polyamino compound, and compounds in which a sulfonic acid of quinonediazide is ester-bonded and/or sulfonamide-bonded to a polyhydroxypolyamino compound. In such a polyhydroxy compound and a polyamino compound, 50 mol % or more of the entire functional groups are preferably substituted with a sulfonic acid of quinone diazide.

As the quinone diazide structure, either a 5-naphthoquinone diazide sulfonyl group or a 4-naphthoquinone diazide sulfonyl group is preferably used. A naphthoquinone diazide sulfonyl ester compound having a 4-naphthoquinone diazide sulfonyl group and a 5-naphthoquinone diazide sulfonyl group in one molecule may be included, or a 4-naphthoquinone diazide sulfonyl ester compound and a 5-naphthoquinone diazide sulfonyl ester compound may be included. The 4-naphthoquinone diazide sulfonyl ester compound has absorption in the i-line region of a mercury lamp, and is suitable for i-line exposure. The 5-naphthoquinone diazide sulfonyl ester compound has an absorption in a region extending to the g-line region of a mercury lamp, and is suitable for g-line exposure.

It is preferable to select a 4-naphthoquinone diazide sulfonyl ester compound or a 5-naphthoquinone diazide sulfonyl ester compound according to the wavelength of light for exposure, but a 4-naphthoquinone diazide sulfonyl ester compound is preferably included from the viewpoint of enhancing the sensitivity. From the viewpoint of the long-term reliability when the cured film of the present invention described below is used as a planarization layer and/or an insulation layer in an organic EL display apparatus, a 5-naphthoquinone diazide sulfonyl ester compound is preferable. However, in the present invention, the long-term reliability can be improved by the fact that the polyimide precursor (a) and the phenol compound (b) are included, and therefore a 4-naphthoquinonediazide sulfonyl ester compound can be suitably used.

The quinone diazide compound can be synthesized by an arbitrary esterification reaction from a compound having a phenolic hydroxyl group and a quinone diazide sulfonic acid compound. Use of these quinone diazide compounds leads to further improvement in the resolution, the sensitivity, and the residual film rate.

In the present invention, sulfonium salts, phosphonium salts, diazonium salts, and iodonium salts are preferable among the photo acid generators (c1) because these salts moderately stabilize the acid component generated through exposure. Among the salts, sulfonium salts are preferable. Furthermore, a sensitizer or the like may be included if necessary.

In the present invention, in a case where the photo acid generator (c1) is used, the content is preferably 0.1 parts by mass or more, more preferably 10 parts by mass or more, and still more preferably 25 parts by mass or more based on 100 parts by mass of the polyimide precursor (a) from the viewpoint of enhancing the sensitivity. The content is preferably 100 parts by mass or less from the viewpoint of further improving the chemical resistance of the cured film. The content of the photo acid generator (c1) is preferably small from the viewpoint of improving the long-term reliability when the cured film of the present invention described below is used as a planarization layer and/or an insulation layer in an organic EL display apparatus. However, in the present invention, the long-term reliability can be improved by the fact that the polyimide precursor (a) and the phenol compound (b) are included, and therefore the content of the photo acid generator (c1) can be increased for enhancing the sensitivity.

Examples of the photo initiator (c2) include benzyl ketal-based photo initiators, α-hydroxyketone-based photo initiators, α-aminoketone-based photo initiators, acylphosphine oxide-based photo initiators, oxime ester-based photo initiators, acridine-based photo initiators, titanocene-based photo initiators, benzophenone-based photo initiators, acetophenone-based photo initiators, aromatic ketoester-based photo initiators, and benzoic acid ester-based photo initiators. Two or more of the photo initiators (c2) may be included. From the viewpoint of further improving the sensitivity, α-aminoketone-based photo initiators, acylphosphine oxide-based photo initiators, and oxime ester-based photo initiators are more preferable.

Examples of the α-aminoketone-based photo initiator include 2-methyl-1-[4-(methylthio)phenyl]-2-morpholino-propane-1-one, 2-benzyl-2-dimethylamino-1-(4-morpholinophenyl)-butan-1-one, 2-dimethylamino-2-(4-methylbenzyl)-1-(4-morpholinophenyl)-butan-1-one, and 3,6-bis (2-methyl-2-morpholinopropionyl)-9-octyl-9H-carbazole.

Examples of the acylphosphine oxide-based photo initiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester-based photo initiator include 1-phenylpropane-1,2-dione-2-(O-ethoxycarbonyl)oxime, 1-phenylbutane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime, 1-[4-[4-(carboxyphenyl)thio]phenyl]propane-1,2-dione-2-(O-acetyl)oxime, 1-[9-ethyl-6-(2-methylbenzoyl)-9H-carbazole-3-yl]ethanone-1-(O-acetyl) oxime, 1-[9-ethyl-6-[2-methyl-4-[1-(2,2-dimethyl-1,3-dioxolan-4-yl)methyloxy]benzoyl]-9H-carbazol-3-yl] ethanone-1-(O-acetyl)oxime, and 1-(9-ethyl-6-nitro-9H-carbazole-3-yl)-1-[2-methyl-4-(1-meth oxypropane-2-yloxy)phenyl]methanone-1-(O-acetyl)oxime.

In the present invention, in a case where the photo initiator (c2) is used, the content is preferably 0.1 parts by mass or more, more preferably 1 part by mass or more, and still more preferably 10 parts by mass or more based on 100 parts by mass of the total of the polyimide precursor (a) and the radically polymerizable compound described below, from the viewpoint of enhancing the sensitivity. The content is preferably 50 parts by mass or less from the viewpoint of further improving the resolution and reducing the taper angle. The content of the photo initiator (c2) is preferably small from the viewpoint of improving the long-term reliability when the cured film of the present invention described below is used as a planarization layer and/or an insulation layer in an organic EL display apparatus. However, in the present invention, the long-term reliability can be improved by the fact that the polyimide precursor (a) and the phenol compound (b) are included, and therefore the content of the photo initiator (c2) can be increased for enhancing the sensitivity.

<Colorant (d)>

The photosensitive resin composition of the present invention preferably further includes a colorant (d). To the photosensitive resin composition including the colorant (d), a light shielding property can be imparted for shielding light having a wavelength absorbed by the colorant (d) from light transmitted through the film of the photosensitive resin composition or light reflected from the film of the photosensitive resin composition. When the cured film of the present invention described below is used as a planarization layer and/or an insulation layer in an organic EL display apparatus, if the light shielding property is imparted, it is possible to prevent deterioration, malfunction, leakage current, and the like due to intrusion of light into the TFT. Furthermore, external light reflection from the wiring and the TFT can be suppressed, and the contrast between the light-emitting area and the non-light-emitting area can be improved.

As the colorant (d), a dye (d1) and/or a pigment (d2) is preferably used. At least one colorant (d) is to be included, and examples of the method of including at least one colorant (d) include a method in which one dye or organic pigment is used, a method in which two or more dyes or two or more pigments are used in combination, and a method in which one or more dyes and one or more pigments are used in combination.

In the present invention, a colorant having an absorption maximum at 400 to 750 nm is preferably selected.

The colorant (d) in the present invention is preferably a dye (d1) from the viewpoint of solubility in a solvent. The pigment (d2) is preferable from the viewpoint of suppressing discoloration of the colorant in the step of heat-curing the photosensitive resin composition or the photosensitive resin sheet of the present invention described below. However, in the present invention, the fact that the polyimide precursor (a) and the phenol compound (b) are included enables curing at a temperature of 200° C. or lower, and therefore discoloration of the colorant in the step of heat-curing can be suppressed even when the dye (d1) is used. Therefore, the dye (d1) can also be suitably used.

In the photosensitive resin composition of the present invention, the colorant (d) preferably includes a dye (d1-1) and/or a pigment (d2-1) having an absorption maximum at a wavelength in the range of 400 nm or more and less than 490 nm (d-1). Hereinafter, the above-described dye and pigment are sometimes simply referred to as a component (d1-1), a component (d2-1), and a component (d-1), respectively.

In the present invention, the dye (d1-1) used as the component (d-1) is preferably a dye that is soluble in an organic solvent that dissolves the polyimide precursor (a) and compatible with a resin, and has high heat resistance and high light resistance, from the viewpoint of storage stability and discoloration at the time of curing or light irradiation. The component (d1-1) has an absorption maximum at a wavelength in the range of 400 nm or more and less than 490 nm, so that examples thereof include yellow dyes and orange dyes. Examples of the dye include oil-soluble dyes, disperse dyes, reactive dyes, acidic dyes, and direct dyes.

Examples of the skeleton structure of the dye include anthraquinone-based, azo-based, phthalocyanine-based, methine-based, oxazine-based, quinoline-based, triarylmethane-based, and xanthene-based structures, but are not limited thereto. Among the skeleton structures, anthraquinone-based, azo-based, methine-based, triarylmethane-based, and xanthene-based structures are preferable from the viewpoint of solubility in an organic solvent and heat resistance. These dyes may be used singly or as a metal-containing complex salt system. Specifically, dyes having an absorption maximum at a wavelength in the range of 400 nm or more and less than 490 nm are available among Sumilan and Lanyl dyes (manufactured by Sumitomo Chemical Industry Company Limited), Orasol, Oracet, Filamid, and Irgasperse dyes (manufactured by Ciba Specialty Chemicals Inc.), Zapon, Neozapon, Neptune, and Acidol dyes (manufactured by BASF SE), Kayaset and Kayakalan dyes (manufactured by Nippon Kayaku Co., Ltd.), a Valifast Colors dye (manufactured by ORIENT CHEMICAL INDUSTRIES CO., LTD.), Savinyl, Sandoplast, Polysynthren, and Lanasyn dyes (manufactured by Clariant (Japan) K.K.), an Aizen Spilon dye (manufactured by Hodogaya Chemical Co., Ltd.), functional dyes (manufactured by Yamada Chemical Co., Ltd.), a Plast Color dye and an Oil Color dye (manufactured by ARIMOTO CHEMICAL Co., Ltd.), and the like. But the dyes are not limited thereto. These dyes are used singly or in combination.

In the present invention, the pigment (d2-1) used as the component (d-1) is preferably a pigment having high heat resistance and high light resistance from the viewpoint of discoloration at the time of curing or light irradiation.

Specific examples of the organic pigment used as such a pigment are indicated by color index (CI) numbers. Examples of the yellow pigment include Pigment Yellow 83, 117, 129, 138, 139, 150, and 180. Examples of the orange pigment include Pigment Orange 38, 43, 64, 71, and 72. A pigment other than these pigments can also be used.

The content of the component (d-1) used in the present invention is preferably 0.1 to 300 parts by mass, more preferably 0.2 to 200 parts bymass, and particularly preferably 1 to 200 parts by mass based on 100 parts by mass of the polyimide precursor (a). If the content of the component (d-1) is 0.1 parts by mass or more, light having a corresponding wavelength can be absorbed. If the content is 300 parts by mass or less, light having a corresponding wavelength can be absorbed while the adhesion strength between the photosensitive colored resin film and the substrate, and the heat resistance and the mechanical characteristic of the heat-treated film are maintained.

In the present invention, as the component (d2-1), an organic pigment may be used that is subjected to surface treatment such as rosin treatment, acidic group treatment, or basic group treatment if necessary. The organic pigment can be used together with a dispersant in some cases. Examples of the dispersant include cation-based, anion-based, nonionic, amphoteric, silicone-based, and fluorine-based surfactants.

The colorant (d) used in the photosensitive resin composition of the present invention preferably includes a dye (d1-2) and/or a pigment (d2-2) having an absorption maximum at a wavelength in the range of 490 nm or more and less than 580 nm (d-2). Hereinafter, the above-described dye and pigment are sometimes simply referred to as a component (d1-2), a component (d2-2), and a component (d-2), respectively.

In the present invention, the dye used as the component (d1-2) is preferably a dye that is soluble in an organic solvent that dissolves the polyimide precursor (a) and compatible with a resin, and has high heat resistance and high light resistance, from the viewpoint of storage stability and discoloration at the time of curing or light irradiation. The component (d1-2) has an absorption maximum at a wavelength in the range of 490 nm or more and less than 580 nm, so that examples thereof include red dyes and violet dyes. Examples of the dye include oil-soluble dyes, disperse dyes, reactive dyes, acidic dyes, and direct dyes.

Examples of the skeleton structure of the dye include anthraquinone-based, azo-based, phthalocyanine-based, methine-based, oxazine-based, quinoline-based, triarylmethane-based, and xanthene-based structures, but are not limited thereto. Among the skeleton structures, anthraquinone-based, azo-based, methine-based, triarylmethane-based, and xanthene-based structures are preferable from the viewpoint of solubility in an organic solvent and heat resistance. These dyes may be used singly or as a metal-containing complex salt system. Specifically, dyes having an absorption maximum at a wavelength in the range of 490 nm or more and less than 580 nm are available among Sumilan and Lanyl dyes (manufactured by Sumitomo Chemical Industry Company Limited), Orasol, Oracet, Filamid, and Irgasperse dyes (manufactured by Ciba Specialty Chemicals Inc.), Zapon, Neozapon, Neptune, and Acidol dyes (manufactured by BASF SE), Kayaset and Kayakalan dyes (manufactured by Nippon Kayaku Co., Ltd.), a Valifast Colors dye (manufactured by ORIENT CHEMICAL INDUSTRIES CO., LTD.), Savinyl, Sandoplast, Polysynthren, and Lanasyn dyes (manufactured by Clariant (Japan) K.K.), an Aizen Spilon dye (manufactured by Hodogaya Chemical Co., Ltd.), functional dyes (manufactured by Yamada Chemical Co., Ltd.), a Plast Color dye and an Oil Color dye (manufactured by ARIMOTO CHEMICAL Co., Ltd.), and the like. But the dyes are not limited thereto. These dyes are used singly or in combination.

In the present invention, the pigment (d2-2) used as the component (d-2) is preferably a pigment having high heat resistance and high light resistance from the viewpoint of discoloration at the time of curing or light irradiation.

Specific examples of the organic pigment used as such a pigment are indicated by color index (CI) numbers. Examples of the red pigment include Pigment Red 48:1, 122, 168, 177, 202, 206, 207, 209, 224, 242, and 254. Examples of the violet pigment include Pigment Violet 19, 23, 29, 32, 33, 36, 37, and 38. A pigment other than these pigments can also be used.

The content of the component (d-2) used in the present invention is preferably 0.1 to 300 parts by mass, more preferably 0.2 to 200 parts bymass, and particularly preferably 1 to 200 parts by mass based on 100 parts by mass of the polyimide precursor (a). If the content of the component (d-2) is 0.1 parts by mass or more, light having a corresponding wavelength can be absorbed. If the content is 300 parts by mass or less, light having a corresponding wavelength can be absorbed while the adhesion strength between the photosensitive colored resin film and the substrate, and the heat resistance and the mechanical characteristic of the heat-treated film are maintained.

In the present invention, as the component (d2-2), an organic pigment may be used that is subjected to surface treatment such as rosin treatment, acidic group treatment, or basic group treatment if necessary. The organic pigment can be used together with a dispersant in some cases. Examples of the dispersant include cation-based, anion-based, non-ionic, amphoteric, silicone-based, and fluorine-based surfactants.

The colorant (d) used in the photosensitive resin composition of the present invention preferably includes a dye (d1-3) and/or a pigment (d2-3) having an absorption maximum at a wavelength in the range of 580 nm or more and less than 800 nm (d-3).

In the present invention, the dye (d1-3) used as the component (d-3) is preferably a dye that is soluble in an organic solvent that dissolves the polyimide precursor (a) and compatible with a resin, and has high heat resistance and high light resistance, from the viewpoint of storage stability and discoloration at the time of curing or light irradiation. The component (d1-3) has an absorption maximum at a wavelength in the range of 580 nm or more and less than 800 nm, so that examples thereof include blue dyes and green dyes. Examples of the dye include oil-soluble dyes, disperse dyes, reactive dyes, acidic dyes, and direct dyes.

Examples of the skeleton structure of the dye include anthraquinone-based, azo-based, phthalocyanine-based, methine-based, oxazine-based, quinoline-based, triarylmethane-based, and xanthene-based structures, but are not limited thereto. Among the skeleton structures, anthraquinone-based, azo-based, methine-based, triarylmethane-based, and xanthene-based structures are preferable from the viewpoint of solubility in an organic solvent and heat resistance. These dyes may be used singly or as a metal-containing complex salt system. Specifically, dyes having an absorption maximum at a wavelength in the range of 580 nm or more and less than 800 nm are available among Sumilan and Lanyl dyes (manufactured by Sumitomo Chemical Industry Company Limited), Orasol, Oracet, Filamid, and Irgasperse dyes (manufactured by Ciba Specialty Chemicals Inc.), Zapon, Neozapon, Neptune, and Acidol dyes (manufactured by BASF SE), Kayaset and Kayakalan dyes (manufactured by Nippon Kayaku Co., Ltd.), a Valifast Colors dye (manufactured by ORIENT CHEMICAL INDUSTRIES CO., LTD.), Savinyl, Sandoplast, Polysynthren, and Lanasyn dyes (manufactured by Clariant (Japan) K.K.), an Aizen Spilon dye (manufactured by Hodogaya Chemical Co., Ltd.), functional dyes (manufactured by Yamada Chemical Co., Ltd.), a Plast Color dye and an Oil Color dye (manufactured by ARIMOTO CHEMICAL Co., Ltd.), and the like. But the dyes are not limited thereto. These dyes are used singly or in combination.

In the present invention, the pigment (d2-3) used as the component (d-3) is preferably a pigment having high heat resistance and high light resistance from the viewpoint of discoloration at the time of curing or light irradiation.

Specific examples of the organic pigment used as such a pigment are indicated by color index (CI) numbers. Examples of the blue pigment include Pigment Blue 15 (15:3, 15:4, 15:6, and the like), 21, 22, 60, and 64. Examples of the green pigment include Pigment Green 7, 10, 36, 47, and 58. A pigment other than these pigments can also be used.

In the present invention, the content of the component (d-3) is preferably 0.1 to 300 parts by mass, more preferably 0.2 to 200 parts by mass, and particularly preferably 1 to 200 parts by mass based on 100 parts by mass of the polyimide precursor (a). If the content of the component (d-3) is 0.1 parts by mass or more, light having a corresponding wavelength can be absorbed. If the content is 300 parts by mass or less, light having a corresponding wavelength can be absorbed while the adhesion strength between the photosensitive colored resin film and the substrate, and the heat resistance and the mechanical characteristic of the heat-treated film are maintained.

In the present invention, as the component (d2-3), an organic pigment may be used that is subjected to surface treatment such as rosin treatment, acidic group treatment, or basic group treatment if necessary. The organic pigment can be used together with a dispersant in some cases. Examples of the dispersant include cation-based, anion-based, non-ionic, amphoteric, silicone-based, and fluorine-based surfactants.

In the present invention, the component (d-1), the component (d-2), and the component (d-3) can be used in combination for blackening. The degree of blackening can be indicated by an optical density (OD value), and the OD value is preferably 0.3 or more, more preferably 0.6 or more, and still more preferably 1.0 or more.

<Thermally Coloring Compound>

The photosensitive resin composition of the present invention may further include a thermally coloring compound. The thermally coloring compound develops a color by heat treatment and has an absorption maximum at 350 nm or more and 700 nm or less, and more preferably develops a color by heat treatment and has an absorption maximum at 350 nm or more and 500 nm or less. If the thermally coloring compound is used in place of the component (d-1) or in combination with the component (d-1), absorption is suppressed at a wavelength region of 350 to 450 nm in exposure of the photosensitive resin composition, and deterioration of the sensitivity can be suppressed.

In the present invention, the thermally coloring compound preferably develops a color at a temperature higher than 120° C., and more preferably develops a color at a temperature higher than 180° C. The higher the temperature at which the thermally coloring compound develops a color is, the more excellent the heat resistance under a high-temperature condition is, and the more excellent the light resistance is so that the less discoloration is caused by long-time irradiation with ultraviolet light or visible light.

In the present invention, the thermally coloring compound may be a general heat-sensitive dye or pressure-sensitive dye, or may be another compound. Examples of the thermally coloring compound include a compound that develops a color by changing its chemical structure or charge state due to the action of an acidic group coexisting in the system during heat treatment, and a compound that develops a color by a thermal oxidation reaction or the like due to oxygen existing in the air.

Examples of the skeleton structure of the thermally coloring compound include a triarylmethane skeleton, a diarylmethane skeleton, a fluoran skeleton, a bislactone skeleton, a phthalide skeleton, a xanthene skeleton, a rhodamine lactam skeleton, a fluorene skeleton, a phenothiazine skeleton, a phenoxazine skeleton, and a spiropyran skeleton. Among the skeletons, a triarylmethane skeleton is preferable because with a triarylmethane skeleton, the thermally coloring temperature is high, and the heat resistance is excellent.

Specific examples of the triarylmethane skeleton include 2,4',4"-methylidene trisphenol, 4,4',4"-methylidene trisphenol, 4,4'-[(4-hydroxyphenyl)methylene]bis(benzenamine), 4,4'-[(4-aminophenyl)methylene]bisphenol, 4,4'-[(4-aminophenyl)methylene]bis[3,5-dimethylphenol], 4,4'-[(2-hydroxyphenyl)methylene]bis[2,3,6-trimethylphenol], 4-[bis(4-hydroxyphenyl)methyl]-2-methoxyphenol, 4,4'-[(2-hydroxyphenyl)methylene]bis[2-methylphenol], 4,4'-[(4-hydroxyphenyl)methylene]bis[2-methylphenol], 4-[bis(4-hydroxyphenyl)methyl]-2-ethoxyphenol, 4,4'-[(4-hydroxyphenyl)methylene]bis[2,6-dimethylphenol], 2,2'-[(4-hydroxyphenyl)methylene]bis[3,5-dimethylphenol], 4,4'-[(4-hydroxy-3-methoxyphenyl)methylene]bis[2,6-dimethyl phenol], 2,2'-[(2-hydroxyphenyl)methylene]bis[2,3,5-trimethylphenol], 4,4'-[(4-hydroxyphenyl)methylene]bis[2,3,6-trimethylphenol], 4,4'-[(2-hydroxyphenyl)methylene]bis[2-cyclohexyl-5-methylphenol], 4,4'-[(4-hydroxyphenyl)methylene]bis[2-cyclohexyl-5-methylphenol], 4,4'-[(3-methoxy-4-hydroxyphenyl)methylene]bis[2-cyclohexyl-5-methylphenol], 4,4'-[(3,4-dihydroxyphenyl)methylene]bis[2-methylphenol], 4,4'-[(3,4-dihydroxyphenyl)methylene]bis[2,6-dimethylphenol], and 4,4'-[(3,4-dihydroxyphenyl)methylene]bis[2,3,6-trimethylphenal]. These skeletons are used singly or in combination. A hydroxyl group-containing compound having the triarylmethane skeleton may be used as a quinone diazide compound obtained by ester-bonding a sulfonic acid of naphthoquinone diazide to the hydroxyl group-containing compound.

In the present invention, in a case where the thermally coloring compound is included, the content is preferably 5 to 80 parts by mass, and particularly preferably 10 to 60 parts by mass based on 100 parts by mass of the polyimide precursor (a). If the content of the thermally coloring compound is 5 parts by mass or more, the transmittance of the cured film in the ultraviolet and visible light region can be reduced. If the content is 80 parts by mass or less, the heat resistance and the strength of the cured film can be maintained, and the water absorption rate can be reduced.

<Resin Other than Polyimide Precursor (a)>

The photosensitive resin composition in the present invention may include a resin other than the polyimide precursor (a). Examples of the resin (a) other than the polyimide precursor (a) include, but are not limited to, polyimides, polybenzoxazole precursors, polyamide-imides, polyamide-imide precursors, polyamides, polymers of a radically polymerizable monomer having an acidic group, and phenolic resins. These resins preferably have alkali solubility, and two or more of these resins may be included. Among these resins, polyimides, polybenzoxazole precursors, and copolymers thereof are more preferable because, by the fact that they have high adhesion in development, excellent heat resistance, and a small amount of outgas at high temperature, the long-term reliability is high when the cured film described below is used in an organic EL display apparatus. Here, the term "polybenzoxazole precursor" refers to a resin that is converted into polybenzoxazole by heat treatment or chemical treatment, and examples of the polybenzoxazole precursor include polyhydroxyamide.

<Radically Polymerizable Compound>

The photosensitive resin composition of the present invention may further include a radically polymerizable compound.

The term "radically polymerizable compound" refers to a compound having a plurality of ethylenic unsaturated double bonds in the molecule. At the time of exposure, radical polymerization of the radically polymerizable compound proceeds by radicals generated from the photo initiator (c2). As a result, the part irradiated with light is insolubilized, and thus, a negative pattern can be obtained. Furthermore, by the fact that the radically polymerizable compound is included, photocuring of the part irradiated with light is promoted to further improve the sensitivity. In addition, the crosslinking density after heat curing is improved, so that the hardness of the cured film can be improved.

The radically polymerizable compound is preferably a compound in which radical polymerization is likely to proceed and a (meth)acrylic group is included. From the viewpoint of improving the sensitivity at the time of exposure and improving the hardness of the cured film, a compound having two or more (meth)acrylic groups in the molecule is more preferable. The radically polymerizable compound preferably has a double bond equivalent of 80 to 400 g/mol from the viewpoint of improving the sensitivity at the time of exposure and improving the hardness of the cured film.

Examples of the radically polymerizable compound include trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, and 9,9-bis(4-(meth)acryloxyphenyl)fluorene, and acid modified products, ethylene oxide modified products, and propylene oxide modified products of the above-described compounds.

The photosensitive resin composition of the present invention preferably includes the radically polymerizable compound at a content of 15 parts by mass or more, and more preferably 30 parts by mass or more based on 100 parts by mass of the total of the polyimide precursor (a) and the radically polymerizable compound, from the viewpoint of further improving the sensitivity and reducing the taper angle. From the viewpoint of further improving the heat resistance of the cured film and reducing the taper angle, the content is preferably 65 parts by mass or less, and more preferably 50 parts by mass or less.

<Thermal Crosslinking Agent>

The photosensitive resin composition of the present invention may further include a thermal crosslinking agent. The term "thermal crosslinking agent" refers to a compound having at least two thermally reactive functional groups such as an alkoxymethyl group, a methylol group, an epoxy group, and an oxetanyl group in the molecule. Because the thermal crosslinking agent is included, the polyimide precursor (a) or another additive component can be crosslinked to improve the heat resistance, the chemical resistance, and the bending resistance of the heat-cured film. The thermal crosslinking agent preferably has no epoxy group and no oxetanyl group from the viewpoint of improving the imidization rate at the time of firing at low temperature and improving the long-term reliability when the cured film of the present invention described below is used as a planarization layer and/or an insulation layer in an organic EL display apparatus. This is because it is presumed that in a case where the photosensitive resin composition of the present invention includes a thermal crosslinking agent having a group such as an epoxy group or an oxetanyl group that reacts with a phenolic hydroxyl group, the phenolic hydroxyl group of the phenol compound (b) reacts with the thermal crosslinking agent, resulting in reduction in the effect of the present invention.

Preferable examples of the compound having at least two alkoxymethyl or methylol groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (all trade names, manufactured by Honshu Chemical Industry Co., Ltd.), "NIKALAC" (registered trademark) MX-290, "NIKALAC" MX-280, "NIKALAC" MX-270, "NIKALAC" MX-279, "NIKALAC" MW-100LM, and "NIKALAC" MX-750LM (all trade names, manufactured by SANWA Chemical Co., Ltd.).

Preferable examples of the compound having at least two epoxy groups include "EPOLIGHT" (registered trademark) 40E, "EPOLIGHT" 100E, "EPOLIGHT" 200E, "EPOLIGHT" 400E, "EPOLIGHT" 70P, "EPOLIGHT" 200P, "EPOLIGHT" 400P, "EPOLIGHT" 1500NP, "EPOLIGHT" 80MF, "EPOLIGHT" 4000, and "EPOLIGHT" 3002 (all manufactured by Kyoeisha Chemical Co., Ltd.), "DENACOL" (registered trademark) EX-212L, "DENACOL" EX-214L, "DENACOL" EX-216L, and "DENACOL" EX-850L (all manufactured by Nagase ChemteX Corporation), GAN and GOT (all manufactured by Nippon Kayaku Co., Ltd.), "EPIKOTE" (registered trademark) 828, "EPIKOTE" 1002, "EPIKOTE" 1750, "EPIKOTE" 1007, YX8100-BH30, E1256, E4250, and E4275 (all manufactured by Japan Epoxy Resin Co., Ltd.), "EPICLON" (registered trademark) EXA-9583 and HP4032 (all manufactured by DIC Corporation), VG3101 (manufactured by Mitsui Chemicals, Inc.), "TEPIC" (registered trademark) S, "TEPIC" G, and "TEPIC" P (all manufactured by Nissan Chemical Industries, Ltd.), "DENACOL" EX-321L (manufactured by Nagase ChemteX Corporation), NC6000 (manufactured by Nippon Kayaku Co., Ltd.), "Epotohto" (registered trademark) YH-434L (manufactured by Tohto Kasei Co., Ltd.), EPPN502H and NC3000 (manufactured by Nippon Kayaku Co., Ltd.), and "EPICLON" (registered trademark) N695 and HP7200 (all manufactured by DIC Corporation).

Preferable examples of the compound having at least two oxetanyl groups include ETERNACOLL EHO, ETERNACOLL OXBP, ETERNACOLL OXTP, and ETERNACOLL OXMA (all manufactured by Ube Industries, Ltd.), and oxetanized phenol novolac.

Two or more of the thermal crosslinking agents may be included in combination.

In a case where the thermal crosslinking agent is included, the content is preferably 1% by mass or more and 30% by mass or less based on 100% by mass of the total amount of the photosensitive resin composition excluding the solvent. If the content of the thermal crosslinking agent is 1 part by mass or more, the chemical resistance and the bending resistance of the cured film can be further enhanced. If the content of the thermal crosslinking agent is 30 parts by mass or less, the amount of outgas from the cured film can be further reduced, the long-term reliability of an organic EL display apparatus can be further enhanced, and the storage stability of the photosensitive resin composition is also excellent.

<Solvent>

The photosensitive resin composition of the present invention may further include a solvent. By including the solvent, the photosensitive resin composition can be in a state of varnish, and the coating property can be improved.

Examples of the solvent include polar aprotic solvents such as γ-butyrolactone, ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane, ketones such as acetone, methyl ethyl ketone, diisobutyl ketone, cyclohexanone, 2-heptanone, 3-heptanone, and diacetone alcohol, esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate, other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate, aromatic hydrocarbons such as toluene and xylene, amides such as N-methylpyrrolidone, N,N-dimethylformamide, N,N-dimethylacetamide, 3-methoxy-N,N-dimethylpropionamide, 3-butoxy-N,N-dimethylpropionamide, N,N-dimethylpropanamide, and N,N-dimethylisobutylamide, and 3-methyl-2-oxazolidinone. Two or more of these solvents may be included.

In a case where the solvent is included, the content is not particularly limited, and is preferably 100 to 3,000 parts by mass, and more preferably 150 to 2,000 parts by mass based on 100 parts by mass of the total amount of the photosensitive resin composition excluding the solvent. In 100% by mass of the total solvent, the proportion of a solvent having a boiling point of 180° C. or higher is preferably 20% by mass or less, and more preferably 10% by mass or less. By setting the proportion of the solvent having a boiling point of 180° C. or higher to 20% by mass or less, it is possible to further reduce the amount of outgas after heat curing and further enhance the long-term reliability of an organic EL apparatus.

<Adhesion Promoter>

The photosensitive resin composition of the present invention may further include an adhesion promoter. Examples of the adhesion promoter include silane coupling agents such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane, titanium chelating agents, aluminum chelating agents, and compounds obtained by reacting an aromatic amine compound with an alkoxy group-containing silicon compound. Two or more of these adhesion promoters may be included. By the fact that such an adhesion promoter is included, it is possible to enhance the adhesion, in development or the like, of a resin film with an underlying substrate such as a silicon wafer, indium tin oxide (ITO), $SiO_2$, or silicon nitride. Furthermore, it is possible to enhance the resistance to oxygen plasma and UV ozone treatment used for cleaning and the like. In a case where the adhesion promoter is included, the content is preferably 0.01 to 10% by mass based on 100% by mass of the total amount of the photosensitive resin composition excluding the solvent.

<Surfactant>

The photosensitive resin composition of the present invention may further include a surfactant, if necessary, to improve the wettability with a substrate. Examples of the surfactant include fluorine-based surfactants such as SH series, SD series, and ST series manufactured by Toray Dow Corning, BYK series manufactured by BYK JAPAN K.K., KP series manufactured by Shin-Etsu Chemical Co., Ltd., DISFOAM series manufactured by NOF CORPORATION, "MEGAFACE (registered trademark)" series manufactured by DIC Corporation, Fluorad series manufactured by Sumitomo 3M Limited, "SURFLON (registered trademark)" series and "AsahiGuard (registered trademark)" series manufactured by Asahi Glass Co., Ltd., and POLYFOX series manufactured by OMNOVA Solutions Inc., and acryl-based and/or methacryl-based surfactants such as POLYFLOW series manufactured by Kyoeisha Chemical Co., Ltd. and "DISPARLON (registered trademark)" series manufactured by Kusumoto Chemicals, Ltd.

In a case where the surfactant is included, the content is preferably 0.001 to 1% by mass based on 100% by mass of the total amount of the photosensitive resin composition excluding the solvent.

<Inorganic Particle>

The photosensitive resin composition of the present invention may further include an inorganic particle. Preferable specific examples of the inorganic particle include silicon oxide, titanium oxide, barium titanate, alumina, and talc. The inorganic particle preferably has a primary particle size of 100 nm or less, and more preferably 60 nm or less.

In a case where the inorganic particle is included, the content is preferably 5 to 90% by mass based on 100% by mass of the total amount of the photosensitive resin composition excluding the solvent.

<Method for Producing Photosensitive Resin Composition>

Next, a method for producing the photosensitive resin composition of the present invention will be described. The photosensitive resin composition of the present invention can be obtained by, for example, dissolving the polyimide precursor (a), the phenol compound (b), and the photosensitive compound (c), and, if necessary, the colorant (d), the thermally coloring compound, the radically polymerizable compound, the thermal crosslinking agent, the solvent, the adhesion promoter, the surfactant, the inorganic particle, and the like.

Examples of the method of dissolution include stirring and heating. In the case of heating, the heating temperature is preferably set within a range such that the performance of the photosensitive resin composition is not impaired, and is usually room temperature to 80° C. The order of dissolving the components is not particularly limited, and examples of the method include a method in which the compounds are dissolved in the order of ascending solubility. Components that are likely to generate bubbles at the time of stirring and dissolution, such as surfactants and some adhesion promoters, can be added last after dissolving other components to prevent poor dissolution of other components due to generation of bubbles.

The obtained photosensitive resin composition is preferably filtered using a filtration filter to remove dust and particles. The pore size of the filter is, for example, 0.5 μm, 0.2 μm, 0.1 μm, 0.07 μm, 0.05 μm, or 0.02 μm, but is not limited thereto. Examples of the material of the filtration filter include polypropylene (PP), polyethylene (PE), nylon (NY), and polytetrafluoroethylene (PTFE). Among the materials, polyethylene and nylon are preferable.

<Photosensitive Resin Film and Photosensitive Resin Sheet>

The photosensitive resin sheet of the present invention includes the photosensitive resin composition of the present invention. The photosensitive resin sheet of the present invention can be obtained by, for example, applying the photosensitive resin composition of the present invention to a peelable substrate such as polyethylene terephthalate and drying the photosensitive resin composition.

In the present invention, the photosensitive resin film can be obtained by applying the photosensitive resin composition of the present invention to obtain a coating film of the photosensitive resin composition, and drying the coating film. The photosensitive resin sheet may be used as a photosensitive resin film.

Examples of the method of applying the photosensitive resin composition of the present invention include a spin coating method, a slit coating method, a dip coating method, a spray coating method, and a printing method. Among the methods, the slit coating method is preferable because a coating liquid can be applied in a small amount to be advantageous for cost reduction. The amount of the coating liquid to be used in the slit coating method is, for example, about ⅕ to 1/10 of that in the spin coating method. As the slit nozzle used for application, slit nozzles put on the market from a plurality of manufacturers can be selected. Examples of the slit nozzle include "Linear Coater" manufactured by Dainippon Screen Mfg. Co., Ltd., "Spinless" manufactured by TOKYO OHKA KOGYO CO., LTD., "TSCoater" manufactured by Toray Engineering Co., Ltd., "Table Coater" manufactured by CHUGAI RO CO., LTD., "CS Series" and "CL Series" manufactured by Tokyo Electron Ltd., "In-line type slit coater" manufactured by CERMATRONICS BOEKI Co., Ltd., and "Head Coater HC series" manufactured by Hirata Corporation. The application speed is generally in the range of 10 mm/sec to 400 mm/sec. The coating film is usually formed so that the thickness of the dried film is 0.1 to 10 µm, and preferably 0.3 to 5 µm although the film thickness depends on, for example, the solid content concentration and the viscosity of the resin composition.

Prior to the application, the substrate to which the photosensitive resin composition is applied may be pretreated with the above-described adhesion promoter in advance. Examples of the method of pretreatment include a method in which the surface of the substrate is treated with a solution prepared by dissolving 0.5 to 20% by mass of the adhesion promoter in a solvent such as isopropanol, ethanol, methanol, water, tetrahydrofuran, propylene glycol monomethyl ether acetate, propylene glycol monomethyl ether, ethyl lactate, or diethyl adipate. Examples of the method of treating the surface of the substrate include a spin coating method, a slit die coating method, a bar coating method, a dip coating method, a spray coating method, and a steam treatment method.

After the application, vacuum drying treatment is performed if necessary.

The vacuum drying rate depends on the volume of the vacuum chamber, the capacity of the vacuum pump, the diameter of the pipe between the chamber and the pump, and the like, but, for example, is preferably set to a condition that the pressure in the vacuum chamber is reduced to 40 Pa after a lapse of 60 seconds in the absence of the coated substrate. The general vacuum drying time is often about 30 seconds to 100 seconds, and the ultimate pressure in the vacuum chamber at the end of vacuum drying is usually 100 Pa or less in the presence of the coated substrate. By setting the ultimate pressure to 100 Pa or less, it is possible to bring the coating film into a dry state in which stickiness of the surface of the coating film is reduced, and as a result, it is possible to suppress surface contamination and generation of particles in the subsequent substrate conveyance.

After the application or vacuum drying, the coating film is generally heated and dried. This step is also referred to as prebaking. For drying, a hot plate, an oven, an infrared ray, or the like is used. In the case of using a hot plate, the coating film is held and heated directly on the plate, or on a jig such as a proxy pin installed on the plate. The heating time is preferably 1 minute to several hours. The heating temperature depends on the kind and the purpose of the coating film, but is preferably 80° C. or higher, and more preferably 90° C. or higher from the viewpoint of promoting solvent drying at the time of prebaking. From the viewpoint of reducing the progress of imidization at the time of prebaking, the heating temperature is preferably 150° C. or lower, and more preferably 140° C. or lower. By the fact that the photosensitive resin composition of the present invention includes the polyimide precursor (a) and the phenol compound (b), the progress of imidization at the time of prebaking can be suppressed, and a cured film having a high imidization rate can be obtained even in a case where firing is performed at a temperature of 200° C. or lower.

In the photosensitive resin film and the photosensitive resin sheet, a pattern can be formed. For example, the photosensitive resin film and the photosensitive resin sheet are irradiated with an actinic ray through a mask having a desired pattern for exposure and development to form a desired pattern.

Examples of the actinic ray used for exposure include ultraviolet rays, visible rays, electron rays, and X-rays. In the present invention, i-line (365 nm), h-line (405 nm), and g-line (436 nm) of a mercury lamp are preferably used. If the film and the sheet have positive photosensitivity, the exposed portion is dissolved in the developer. If the film and the sheet have negative photosensitivity, the exposed portion is cured and insolubilized in the developer.

After the exposure, the exposed portion is removed in the case of the film and the sheet having positive photosensitivity, and the unexposed portion is removed in the case of the film and the sheet having negative photosensitivity with a developer to form a desired pattern. As the developer, an aqueous solution of an alkaline compound is preferable, and examples of the alkaline compound include tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. To the alkaline aqueous solution, one or more components may be added, and examples of the components include polar solvents such as N-methyl-2-pyrrolidone, N,N-dimethylformamide, N,N-dimethylacetamide, dimethylsulfoxide, γ-butyrolactone, and dimethylacrylamide, alcohols such as methanol, ethanol, and isopropanol, esters such as ethyl lactate and propylene glycol monomethyl ether acetate, and ketones such as cyclopentanone, cyclohexanone, isobutyl ketone, and methyl isobutyl ketone. Examples of the method of development include a spray method, a paddle method, an immersion method, and an ultrasonic method.

Next, the pattern formed by development is preferably rinsed with distilled water. The pattern may be rinsed with distilled water to which a component is added, and examples of the component include alcohols such as ethanol and isopropyl alcohol, and esters such as ethyl lactate and propylene glycol monomethyl ether acetate.

<Cured Film>

The cured film of the present invention is obtained by curing the photosensitive resin composition of the present invention or the photosensitive resin sheet of the present invention. By heat-curing the photosensitive resin composition of the present invention or the photosensitive resin sheet of the present invention, a component having low heat resistance can be removed, so that the heat resistance and the chemical resistance can be further improved. The heat resistance and the chemical resistance can be further improved particularly because a polyimide precursor is included and an imide ring is formed by heat-curing in the photosensitive resin composition of the present invention or the photosensitive resin sheet of the present invention.

The cured film of the present invention can be suitably used, for example, as a planarization layer and/or an insulation layer in an organic EL display apparatus including a drive circuit, a planarization layer, a first electrode, an insulation layer, a light-emitting layer, and a second electrode that are placed over a substrate.

The cured film of the present invention can be suitably used, for example, as an interlayer insulation layer and/or a surface protective layer in an electronic component including an electrode, a metal wiring, an interlayer insulation layer and/or a surface protective layer that are placed over a substrate.

<Method for Producing Cured Film>

A first aspect of the method for producing a cured film of the present invention includes the steps of forming a photosensitive resin film including the photosensitive resin composition of the present invention or the photosensitive resin sheet of the present invention on a substrate, exposing the photosensitive resin film, developing the photosensitive resin film that is exposed, and heat-treating, at 200° C. or lower, the photosensitive resin film that is developed.

A second aspect of the method for producing a cured film of the present invention includes the steps of forming a photosensitive resin film including the photosensitive resin composition of the present invention or the photosensitive resin sheet of the present invention on a substrate, exposing the photosensitive resin film, developing the photosensitive resin film that is exposed, and heat-treating, in an atmosphere having an oxygen concentration of 1% or more, the photosensitive resin film that is developed. In the present invention, the term "oxygen concentration" refers to a volume concentration.

The steps of forming a photosensitive resin film, exposing the photosensitive resin film, and developing the photosensitive resin film that is exposed in the method for producing a cured film of the present invention are as described in the above item <Photosensitive Resin Film and Photosensitive Resin Sheet>.

The first aspect of the method for producing a cured film of the present invention includes the step of heat-treating the photosensitive resin film at 200° C. or lower. By the fact that the photosensitive resin composition of the present invention includes the polyimide precursor (a) and the phenol compound (b), a cured film having a high imidization rate can be obtained even in the case of heat-treating the photosensitive resin film at 200° C. or lower. In particular, in a case where the photosensitive resin composition further includes the colorant (d), the photosensitive resin film is preferably heat-treated at 200° C. or lower from the viewpoint of further easily suppressing discoloration of the colorant (d).

In the method for producing a cured film of the present invention, the temperature in the step of heat-treating may be raised stepwise or continuously.

In the method for producing a cured film of the present invention, the atmosphere at the time of heat-curing is preferably an inert gas atmosphere from the viewpoint of further reducing the amount of outgas generated from the cured film and enhancing the long-term reliability when the cured film is used as a planarization layer and/or an insulation layer in an organic EL display apparatus. Specific examples of the inert gas include nitrogen and argon.

In the first aspect of the method for producing a cured film of the present invention, the inert gas atmosphere preferably has an oxygen concentration of 5% or less, more preferably 1% or less, still more preferably 0.5% or less, and particularly preferably 0.01% or less.

In the first aspect of the method for producing a cured film of the present invention, the heating time in the step of heat-treating is preferably 30 minutes or more from the viewpoint of further reducing the amount of outgas. In the present invention, the term "heating time" refers to a holding time at the maximum ultimate temperature in the step of heat-treating. The heating time is preferably 3 hours or less from the viewpoint of improving the film toughness of the cured film. Examples of the method of heat-treating include a method in which heat treatment is performed at 200° C. for 30 minutes, a method in which heat treatment is performed at 150° C. for 30 minutes and 200° C. for 30 minutes, and a method in which heat treatment is performed while the temperature is raised from room temperature to 200° C. linearly over 2 hours.

The second aspect of the method for producing a cured film of the present invention includes the step of heat-treating, in an atmosphere having an oxygen concentration of 1% or more, the photosensitive resin film that is developed. By the fact that the photosensitive resin composition of the present invention includes the polyimide precursor (a) and the phenol compound (b), the long-term reliability can be improved when the cured film is used as a planarization layer and/or an insulation layer in an organic EL display apparatus, and therefore the photosensitive resin film can be suitably heat-cured even at an oxygen concentration of 1% or more.

In the second aspect of the method for producing a cured film of the present invention, the temperature in the step of heat-treating is preferably 180° C. or higher, more preferably 200° C. or higher, still more preferably 230° C. or higher, and particularly preferably 250° C. or higher from the viewpoint of further reducing the amount of outgas generated from the cured film. From the viewpoint of improving the film toughness of the cured film, the temperature is preferably 500° C. or lower, and more preferably 450° C. or lower.

In the second aspect of the method for producing a cured film of the present invention, in a case where the photosensitive resin composition further includes the colorant (d), the temperature in the step of heat-treating is preferably 230° C. or lower, and more preferably 200° C. or lower from the viewpoint of easily suppressing discoloration of the colorant (d).

In the second aspect of the method for producing a cured film of the present invention, the heating time in the step of heat-treating is preferably 30 minutes or more from the viewpoint of further reducing the amount of outgas. The heating time is preferably 3 hours or less from the viewpoint of improving the film toughness of the cured film. Examples of the method of heat-treating include a method in which heat treatment is performed at 250° C. for 30 minutes, a method in which heat treatment is performed at 150° C. for 30 minutes and 250° C. for 30 minutes, and a method in which heat treatment is performed while the temperature is raised from room temperature to 300° C. linearly over 2 hours.

Application Examples of Photosensitive Resin Composition, Photosensitive Resin Sheet, and Cured Film The photosensitive resin composition, the photosensitive resin sheet, and the cured film of the present invention are suitably used in a surface protective layer and an interlayer insulation layer of a semiconductor device, an insulation layer of an organic electroluminescence (hereinafter referred to as EL) device, a planarization layer of a thin film transistor (hereinafter referred to as TFT) substrate to be used for driving a display apparatus in which an organic EL device is used, a wiring protective insulation layer of a circuit substrate, an on-chip microlens of a solid-state imaging device, and planarization layers for various displays and solid-state imaging devices. For example, the photosensitive resin composition, the photosensitive resin sheet, and the cured film are suitable as a surface protective layer or an interlayer insulation layer in an MRAM having low heat resistance or in a promising next-generation memory such as a polymer memory (polymer ferroelectric RAM: PFRAM) or a phase change memory (phase change RAM: PCRAM or ovonics unified memory: OUM). The photosensitive resin composition, the photosensitive resin sheet, and the cured film can also be used in an insulation layer in a display apparatus including a first electrode formed on a substrate and a second electrode provided so as to face to the first electrode, such as a liquid crystal display (LCD), an electrochemical display (ECD), an electroluminescent display (ELD), or a display apparatus in which an organic electroluminescent device is used (organic electroluminescent apparatus). Hereinafter, an organic EL display apparatus, a semiconductor equipment, and a semiconductor electronic component will be described as examples.

<Organic EL Display Apparatus>

The organic EL display apparatus of the present invention includes a substrate, a drive circuit, a planarization layer, a first electrode, an insulation layer, a light-emitting layer, and a second electrode. The drive circuit, the planarization layer, the first electrode, the insulation layer, the light-emitting layer, and the second electrode are placed over the substrate, and the planarization layer and/or the insulation layer includes the cured film of the present invention. Organic light-emitting materials are generally weak against a gas component or moisture, and exposure of the organic light-emitting materials to a gas component or moisture causes deterioration of emission luminance and pixel shrinkage. Here, the term "pixel shrinkage" refers to a phenomenon in which the emission luminance of a pixel deteriorates from the end portion of the pixel, or the pixel is turned off. By the fact that the cured film of the present invention is included in the planarization layer and/or the insulation layer in the organic EL display apparatus of the present invention, the long-term reliability can be improved. The insulation layer particularly has a greater influence on the long-term reliability than the planarization layer because the insulation layer is adjacent to the organic light-emitting material. Therefore, in order to obtain an organic EL display apparatus having high long-term reliability, the cured film of the present invention is preferably included in at least the insulation layer.

Taking an active matrix display apparatus as an example, an active matrix display apparatus includes a TFT and a wiring located on a side portion of the TFT and connected to the TFT that are provided on a substrate such as glass or a plastic, a planarization layer provided on the TFT and the wiring so as to cover the unevenness, and a display device provided on the planarization layer. The display device and the wiring are connected via a contact hole formed in the planarization layer. An organic EL display apparatus is particularly preferable in which the substrate having a drive circuit includes a resin film because flexible organic EL display apparatus are recently the mainstream. In such a flexible display, a cured film obtained by curing the photosensitive resin composition or the photosensitive sheet of the present invention is particularly preferably used as an insulation layer and a planarization layer because such layers have excellent bending resistance. The resin film is particularly preferably a polyimide from the viewpoint of improving the adhesion to a cured film obtained by curing the photosensitive resin composition or the photosensitive sheet of the present invention.

When the cured film of the present invention is used as the planarization layer, the film thickness is preferably 1.0 to 5.0 µm, and more preferably 2.0 µm or more. By setting the film thickness of the planarization layer within the above-described range, it is possible to improve the flatness of the TFT and the wiring that are densely packed for high definition. Increase in the film thickness of the planarization layer leads to increase in the amount of outgas that causes deterioration of long-term reliability of the organic EL display apparatus, but the cured film of the present invention can improve the long-term reliability even if the film thickness is increased. The planarization layer is preferably a multilayer, and more preferably includes 2 to 5 layers because with such a planarization layer, the TFT and the wiring can also be arranged in the film thickness direction for high definition.

FIG. 2 shows a sectional view of an example of a TFT substrate. On a substrate 6, bottom-gate or top-gate thin film transistors (TFTs) 1 are provided in a matrix, and a TFT insulation layer 3 is formed in a state of covering the TFTs 1. On the TFT insulation layer 3, a wiring 2 connected to the TFTs 1 is provided. On the TFT insulation layer 3, a planarization layer 4 is further provided in a state that the wiring 2 is embedded in the planarization layer 4. The planarization layer 4 is provided with contact holes 7 reaching the wiring 2. ITOs (transparent electrodes) 5 are formed on the planarization layer 4 in a state that ITOs 5 are connected to the wiring 2 via the contact holes 7, respectively. Here, each ITO 5 serves as an electrode of a display device (such as an organic EL device). Then, insulation layers 8 are formed so that the insulation layers 8 cover the peripheral edges of the ITOs 5, respectively. The organic EL device may be a top-emission organic EL device that emits light from the side opposite from the substrate 6, or may be a bottom-emission organic EL device that takes out light from the substrate 6 side. In this way, an active matrix organic EL display apparatus is obtained in which each TFT 1 is connected to an organic EL device in order to drive the organic EL device.

The TFT insulation layer 3, the planarization layer 4 and/or the insulation layer 8 can be formed, as described above, by the steps of forming a photosensitive resin film including the photosensitive resin composition or the photosensitive resin sheet of the present invention, exposing the photosensitive resin film, developing the photosensitive resin film that is exposed, and heat-treating the photosensitive resin film that is developed. An organic EL display apparatus can be obtained by a production method including these steps.

<Electronic Component>

The electronic component of the present invention includes a substrate, an electrode, a metal wiring, and an interlayer insulation layer and/or a surface protective layer. The electrode, the metal wiring, and the interlayer insulation layer and/or the surface protective layer are placed over the substrate, and the interlayer insulation layer and/or the surface protective layer at least partially includes the cured film of the present invention.

Specific examples of the electronic component include active components having a semiconductor such as transistors, diodes, integrated circuits (hereinafter referred to as ICs), and memories, and passive components such as resistors, capacitors, and inductors. Hereinafter, an electronic component in which a semiconductor is used is sometimes referred to as a semiconductor equipment.

Specific examples of the cured film in the electronic component include passivation films for semiconductors, semiconductor devices, surface protective films such as TFTs, interlayer insulating films in wiring of multilayer having 2 to 10 layers for high-density mounting, insulation films for touch panel displays, and protective films, but are not limited thereto. The cured film can be used in various structures.

Taking a semiconductor equipment as an example, the stress from the sealing resin can be relaxed even in mounting because the cured film of the present invention has an excellent mechanical characteristic, so that damage to a low-k layer can be suppressed to provide a semiconductor equipment having high reliability.

FIG. 3 shows an enlarged sectional view of an example of a pad portion of a semiconductor equipment having a bump. An Al pad 10 for input/output and a passivation layer 11 having a via hole are formed on a silicon wafer 9. An insulation layer 12 is formed on the passivation layer 11. Furthermore, a metal layer 13 including Cr, Ti, or the like is formed so as to be connected to the Al pad 10, and a metal wiring 14 including Al, Cu, or the like is formed by electrolytic plating or the like. The metal layer 13 located around a solder bump 18 is etched to insulate each pad. A barrier metal 16 and the solder bump 18 are formed for the insulated pad. An insulation film 15 is processed, and at that time, a scribe line 17 is formed.

Next, a method for producing a semiconductor equipment will be described with reference to the drawings. FIG. 4 shows an example of a method for producing a semiconductor equipment having a bump. In the step 3a, the photosensitive resin composition of the present invention is applied to an Al pad 10 and a passivation layer 11 that are formed on a silicon wafer 9, and an insulation layer 12 patterned through a photolithography step is formed. Next, in the step 3b, a metal layer 13 is formed with a sputtering method. In the step 3c, a metal wiring 14 is formed on the metal layer 13 with a plating method. Next, in the step 3d', the photosensitive resin composition of the present invention is applied, and in the step 3d, the pattern of an insulation layer 15 is formed through a photolithography step. At this time, the resin composition included in the insulation layer 15 is subjected to thick film processing in a scribe line 17. An additional wiring (so-called rewiring) can be formed on the insulation layer 15. In the case of forming a multilayer wiring structure having two or more layers, the above-described steps are repeated to form a multilayer wiring structure in which two or more rewirings are separated from each other by the interlayer insulation layer including the cured film of the present invention. There is no upper limit on the number of layers in the multilayer wiring structure, and a structure having 10 or less layers is often used. Subsequently, a barrier metal 16 is formed in the step 3e, and a solder bump 18 is formed in the step 3f. Then, the resulting product is diced along the last scribe line 17 to cut into chips, and thus, a semiconductor equipment having a bump can be obtained.

EXAMPLES

Hereinafter, the present invention will be described with reference to Examples and the like, but the present invention is not limited to Examples and the like described below. Each evaluation in Examples was performed with the following method.

(1) Imidization Rate

The varnish obtained in each of Examples and Comparative Examples was applied to a silicon wafer with a spin coating method using a spin coater (MS-A100 manufactured by Mikasa Co., Ltd.) at an arbitrary rotation speed. Next, the resulting product was baked using a hot plate (SCW-636 manufactured by Dainippon Screen Mfg. Co., Ltd.) at 120° C. for 2 minutes to prepare a prebaked film having a film thickness of 2.0 μm. The film thickness was measured under the condition of a refractive index of 1.63 using Lambda Ace STM-602 manufactured by Dainippon Screen Mfg. Co., Ltd. The obtained prebaked film was cut into three pieces, the first piece was subjected to no treatment, the second piece was heat-treated at 200° C. for 1 hour in a nitrogen atmosphere having an oxygen concentration of 0.01% using an inert oven CLH-21CD-S (manufactured by Koyo Thermo Systems Co., Ltd.), the third piece was heat-treated at 250° C. for 1 hour in a nitrogen atmosphere having an oxygen concentration of 0.01%, and thus, a photosensitive resin composition prebaked film, a cured film at 200° C., and a cured film at 250° C. were prepared.

Infrared absorption spectra of the obtained prebaked film and cured films at 200° C. and 250° C. were obtained using a Fourier transform infrared spectrophotometer (manufactured by JASCO Corporation) with an attenuated total reflection (ATR) method. Assuming that the cured film heated at 250° C. for 1 hour had an imidization rate of 100%, the imidization rate (%) of each of the prebaked film and the cured film at 200° C. was calculated from the ratio of the absorption intensity at 1,371 cm$^{-1}$ derived from C—N—C in the polyimide (A (1,371 cm$^{-1}$)) to the absorption intensity at 1,437 cm$^{-1}$ derived from the benzene ring (A (1,437 cm$^{-1}$)) in each sample using the formula (5). In the formula (5), X (%) represents the imidization rate. The imidization rate of the cured film at 200° C. was judged as "A" if 90% or more, "B" if less than 90% and 75% or more, and "C" if less than 75%. If the imidization rate of the prebaked film was 30% or more, the imidization rate of the cured film at 200° C. was judged as "C" even if 75% or more.

[Mathematical 2]

$$X(\%) = \frac{A_{x°C.}(1371 \text{ cm}^{-1})/A_{x°C.}(1437 \text{ cm}^{-1})}{A_{250°C.}(1371 \text{ cm}^{-1})/A_{250°C.}(1437 \text{ cm}^{-1})} \times 100 \quad (5)$$

(2) Sensitivity (Pattern Processability)

The varnish obtained in each of Examples and Comparative Examples was applied to an 8-inch silicon wafer with a spin coating method using a coating/development apparatus ACT-8 (manufactured by Tokyo Electron Ltd.), and the resulting product was baked at 120° C. for 2 minutes to prepare a prebaked film having a film thickness of 3.0 μm. The film thickness was measured under the condition of a refractive index of 1.63 using Lambda Ace STM-602 manufactured by Dainippon Screen Mfg. Co., Ltd. Then, the prebaked film was exposed at exposure energy increased by 5 mJ/cm$^2$ in the range of 50 to 300 mJ/cm$^2$ through a mask having a pattern of a 10 μm contact hole using an exposure machine i-line stepper NSR-2005i9C (manufactured by NIKON CORPORATION). After the exposure, the exposed prebaked film was developed with the development apparatus of ACT-8 using a 2.38% by mass tetramethylammonium aqueous solution (hereinafter referred to as TMAH, manufactured by TAMA CHEMICALS CO., LTD.) as a developer until the amount of film loss reached 0.5 µm, then rinsed with distilled water, and shaken off and dried to obtain a pattern.

The obtained pattern was observed using an FPD microscope MX 61 (manufactured by OLYMPUS CORPORATION) at a magnification of 20, and the aperture diameter of the contact hole was measured. The minimum exposure energy at which the aperture diameter of the contact hole reached 10 µm was determined and regarded as the sensitivity. The sensitivity was judged as "S" if less than 150 mJ/cm$^2$, "A" if 150 mJ/cm$^2$ or more and less than 200 mJ/cm$^2$, "B" if 200 mJ/cm$^2$ or more and less than 250 mJ/cm$^2$, and "C" if 250 mJ/m$^2$ mJ/cm$^2$ or more.

(3) Residual Film Rate

A prebaked film having a film thickness of 3.0 µm obtained in the same manner as in the item of evaluation (2) Sensitivity was developed for 60 seconds with a development apparatus of ACT-8 using a 2.38% by mass TMAH aqueous solution as a developer, then rinsed with distilled water, and shaken off and dried to obtain a developed film. The rate of the thickness of the developed film to the thickness of the prebaked film was defined as the residual film rate (residual film rate=(thickness of developed film)/ (thickness of prebaked film)×100). The residual film rate was judged as "A" if 80% or more, "B" if less than 80% and 65% or more, and "C" if less than 65%.

(4) Evaluation of Long-Term Reliability of Organic EL Display Apparatus

FIG. 5 shows a schematic view of a procedure for preparation of an organic EL display apparatus. First, an ITO transparent conductive film having a thickness of 10 nm was formed on the entire surface of an alkali-free glass substrate 19 having a size of 38 mm×46 mm with a sputtering method, and etched as a first electrode (transparent electrode) 20. At the same time, an auxiliary electrode 21 configured to take out a second electrode was also formed. The resulting substrate was ultrasonically washed with Semico Clean 56 (trade name, manufactured by Furuuchi Chemical Corporation) for 10 minutes, and then washed with ultrapure water. Next, a photosensitive resin composition shown in Tables 2 and 3 was applied to the entire surface of the resulting substrate with a spin coating method, and the resulting product was prebaked on a hot plate at 120° C. for 2 minutes. The resulting film was subjected to UV exposure through a photomask, then developed with a 2.38% by mass TMAH aqueous solution to dissolve the unnecessary portion, and rinsed with pure water. The obtained resin pattern was heat-treated at 200° C. for 1 hour in a nitrogen atmosphere having an oxygen concentration of 0.01% using an inert oven CLH-21CD-S (manufactured by Koyo Thermo Systems Co., Ltd.). In this way, an insulation layer 22 having a shape in which apertures having a width of 70 µm and a length of 260 µm were arranged at a pitch of 155 µm in the width direction and a pitch of 465 µm in the length direction to expose the first electrode through each aperture was formed only in the substrate effective area. In this way, an insulation layer having an insulation layer aperture ratio of 25% was formed in the substrate effective area having a quadrangular shape having one side length of 16 mm. The insulation layer had a thickness of about 1.0 µm.

Next, the resulting product was subjected to nitrogen plasma treatment as a pretreatment, and then an organic EL layer 23 including a light-emitting layer was formed with a vacuum deposition method. The degree of vacuum at the time of deposition was 1×10$^{-3}$ Pa or less, and the substrate was rotated with respect to the vapor deposition source during deposition. First, a compound (HT-1) was deposited as a hole injection layer in a thickness of 10 nm, and a compound (HT-2) was deposited as a hole transporting layer in a thickness of 50 nm. Next, on the light-emitting layer, a compound (GH-1) as a host material and a compound (GD-1) as a dopant material were deposited in a thickness of 40 nm so that the doping concentration was 10%. Next, a compound (ET-1) and a compound (LiQ) as electron transporting materials were stacked at a volume ratio of 1:1 to a thickness of 40 nm. The structure of the compounds used in the organic EL layer are shown below.

[Chem. 6]

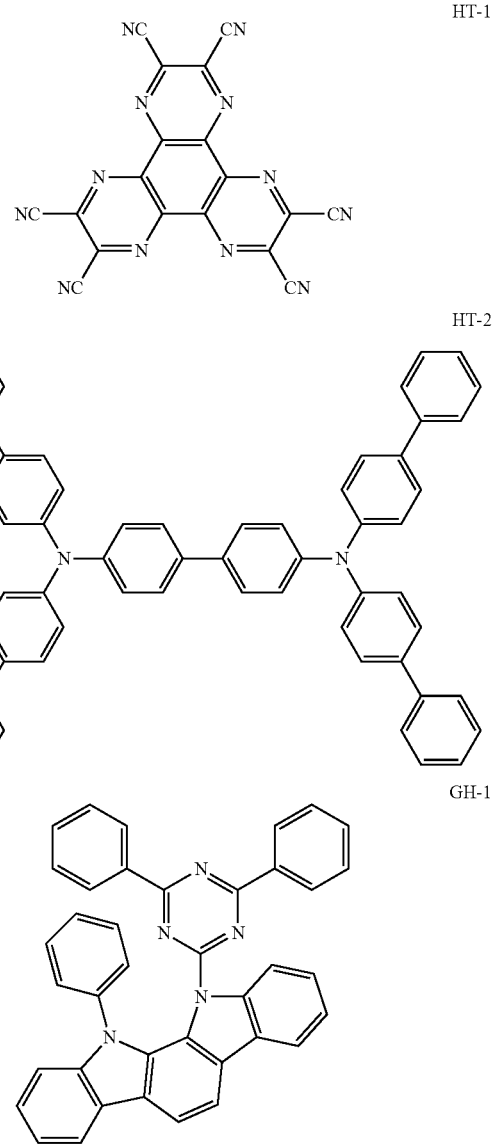

GD-1

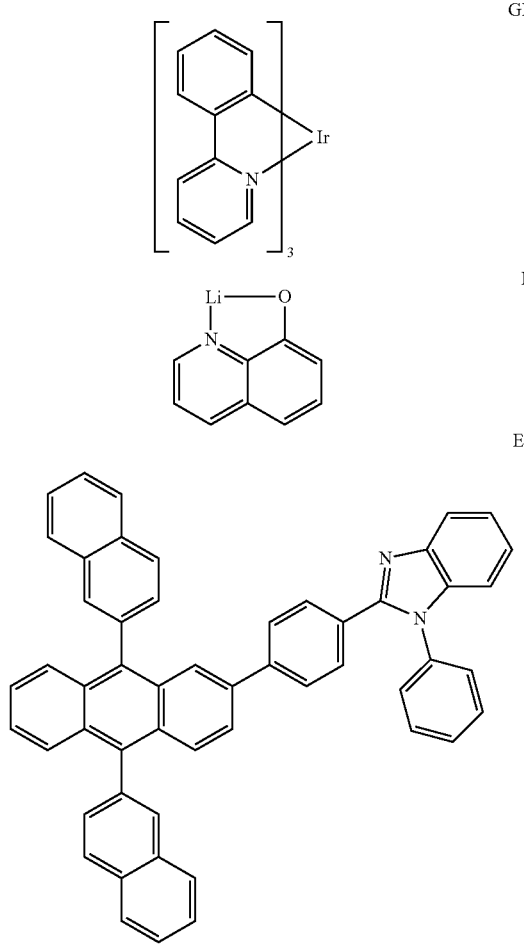

LiQ

ET-1

Next, a compound (LiQ) was deposited in a thickness of 2 nm, and then Mg and Ag were deposited at a volume ratio of 10:1 in a thickness of 10 nm to form a second electrode (non-transparent electrode) 24. Finally, a cap-shaped glass plate was bonded using an epoxy resin-based adhesive in a low-humidity nitrogen atmosphere for sealing, and thus four top-emission organic EL display apparatus each having a quadrangular shape having one side length of 5 mm were prepared on one substrate. Here, the film thickness is a display value in a crystal oscillation film thickness monitor.

The prepared organic EL display apparatus was placed on a hot plate heated to 80° C. in a state that the light-emitting surface faced upward, and irradiated with UV light having a wavelength of 365 nm and an illuminance of 0.6 mW/cm². Immediately after the irradiation (0 hour), and after a lapse of 250 hours, 500 hours, and 1,000 hours, the organic EL display apparatus was driven with direct current of 0.625 mA to emit light, and the ratio of the area of the light-emitting portion to the area of the light-emitting pixel (pixel light-emitting area ratio) was measured. Using this evaluation method, the pixel light-emitting area ratio after a lapse of 1,000 hours was judged as "S" if 80% or more, "A" if less than 80% and 70% or more, "B" if less than 70% and 60% or more, and "C" if less than 60%.

Synthesis Example 1 Synthesis of Hydroxyl Group-Containing Diamine Compound (a)

In 100 mL of acetone and 17.4 g (0.3 mol) of propylene oxide, 18.3 g (0.05 mol) of 2,2-bis(3-amino-4-hydroxyphenyl) hexafluoropropane (hereinafter referred to as BAHF) was dissolved, and the resulting solution was cooled to −15° C. To the cooled solution, a solution prepared by dissolving 20.4 g (0.11 mol) of 3-nitrobenzoyl chloride in 100 mL of acetone was added dropwise. After the termination of the dropping, the resulting solution was reacted at −15° C. for 4 hours and then returned to room temperature. The precipitated white solid was filtered out and vacuum-dried at 50° C.

In a 300 mL stainless steel autoclave, 30 g of the solid was put and dispersed in 250 mL of methyl cellosolve, and 2 g of 5% palladium-carbon was added. Here, hydrogen was introduced with a balloon and the reduction reaction was carried out at room temperature. After about 2 hours, it was confirmed that the balloon did not deflate any more, and the reaction was terminated. After the termination of the reaction, the palladium compound as a catalyst was filtered out and removed, and the filtrate was concentrated with a rotary evaporator to obtain a hydroxyl group-containing diamine compound (a) represented by the following formula (Ip 7.16 eV, calculated value).

[Chem. 7]

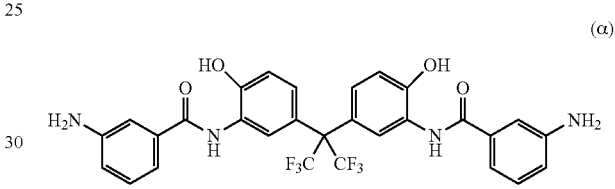

(α)

Synthesis Example 2 Synthesis of Quinone Diazide Compound (c-1)

Under a dry nitrogen stream, 21.22 g (0.05 mol) of TrisP-PA (trade name, manufactured by Honshu Chemical Industry Co., Ltd.) and 36.27 g (0.135 mol) of 5-naphthoquinone diazide sulfonyl chloride were dissolved in 450 g of 1,4-dioxane, and the temperature was controlled to room temperature. Here, 15.18 g of triethylamine mixed with 50 g of 1,4-dioxane was added dropwise under the condition that the temperature inside the system was lower than 35° C. After the dropping, the resulting solution was stirred at 30° C. for 2 hours. The triethylamine salt was filtered out, and the filtrate was put into water. Then, the precipitated precipitate was collected by filtration. The precipitate was dried with a vacuum dryer to obtain a quinone diazide compound (c-1) represented by the following formula.

[Chem. 8]

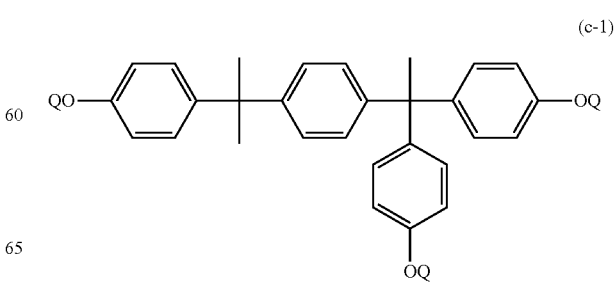

(c-1)

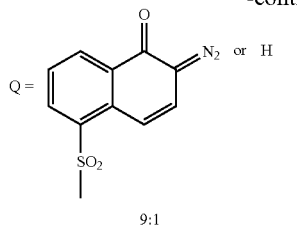

9:1

Synthesis Example 3 Synthesis of Alkali-Soluble Resin (α-1)

Under a dry nitrogen stream, 31.02 g (0.10 mol) of ODPA was dissolved in 500 g of NMP. To the solution, 23.81 g (0.065 mol) of BAHF, 4.25 g (0.02 mol) of o-tolidine, 1.24 g (0.005 mol) of SiDA, and 50 g of NMP were added, and the resulting mixture was reacted at 40° C. for 2 hours. Next, 2.18 g (0.02 mol) of MAP as an end-capping agent and 5 g of NMP were added, and the resulting mixture was reacted at 50° C. for 2 hours. Then, a solution prepared by diluting 32.39 g (0.22 mol) of N,N-dimethylformamide diethyl acetal with 50 g of NMP was added. After the adding, the resulting solution was stirred at 50° C. for 3 hours. After the termination of stirring, the solution was cooled to room temperature, and then put into 3L of water to obtain a white precipitate. The precipitate was collected by filtration, washed with water three times, and then dried with a vacuum dryer at 80° C. for 24 days to obtain a polyimide precursor (α-1).

Synthesis Examples 4 to 15 and Comparative Synthesis Examples 1 to 3

Polyimide precursors (α-2) to (α-13) and (a'-1) to (a'-3) were obtained in the same manner as in Synthesis Example 3 except that the amine component and the acid component were changed as shown in Table 1.

The names of the compounds used in each of Synthesis Examples, Comparative Synthesis Examples, Examples, and Comparative Examples, and the structural formulae of HMOM-TPHAP and VG3101L are shown below.

- o-Tolidine: o-tolidine (Ip 6.58 eV, literature value)
- DAE: 4,4'-diaminodiphenyl ether (Ip 6.78 eV, literature value) (a diamine having an ether bond)
- MDA: 4,4'-diaminodiphenylmethane (Ip 6.94 eV, literature value)
- TDE-R: 1,3-bis(4-aminophenoxy)benzene (Ip 7.08 eV, calculated value) (a diamine having an ether bond)
- BAHF: 2,2-bis(3-amino-4-hydroxyphenyl)hexafluoropropane (Ip 7.88 eV, calculated value)
- SiDA: 1,3-bis(3-aminopropyl)tetramethyldisiloxane (Ip 8.03 eV, calculated value)
- MAP: 3-aminophenol
- ODPA: 3,3',4,4'-diphenyl ether tetracarboxylic acid dianhydride
- 6FDA: 2,2-bis(3,4-dicarboxyphenyl)hexafluoropropane dianhydride
- b-1: bisphenol AF (pKa=10.8) (a phenol compound (b) having an electron withdrawing group and satisfying the requirements of (b1) and (b2))
- b-2: bisphenol S (pKa=9.8) (a phenol compound (b) having an electron withdrawing group and satisfying the requirements of (b1) and (b2))
- b-3: 4,4'-dihydroxybenzophenone (pKa=11.3) (a phenol compound (b) having an electron withdrawing group and satisfying the requirement of (b2))
- b-4: 4-(trifluoromethyl)phenol (pKa=10.5) (a phenol compound (b) having an electron withdrawing group and satisfying the requirement of (b1))
- b-5: 3-(trifluoromethyl)phenol (pKa=11.2) (a phenol compound (b) having an electron withdrawing group)
- b'-1: bisphenol A (pKa=11.6) (a phenol compound having no electron withdrawing group)
- b'-2: p-cresol (pKa=12.8) (a phenol compound having no electron withdrawing group)
- GBL: γ-butyrolactone
- NMP: N-methylpyrrolidone
- TsOH: p-toluenesulfonic acid
- DBU: 1,8-diazabicyclo[5.4.0]-7-undecene

[Chem. 9]

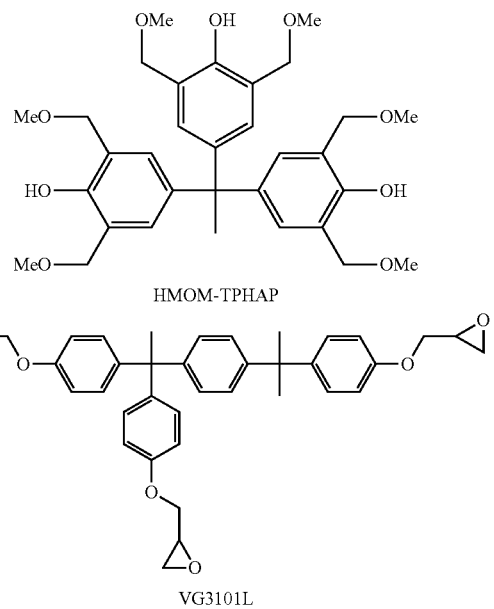

Example 1

To 30 g of GBL, 10.0 g of the polyimide precursor (α-1), 2.0 g of the phenol compound (b-1), and 2.0 g of the quinone diazide compound (c-1) were added to obtain a varnish of a positive photosensitive resin composition. The imidization rate, the sensitivity, the residual film rate, and the long-term reliability of the organic EL display apparatus were evaluated as described above using the obtained varnish.

Examples 2 to 23, Comparative Examples 1 to 7, and Comparative Examples 10 to 15

A varnish of a positive photosensitive resin composition was obtained in the same manner as in Example 1 except that the polyimide precursor (a), the phenol compound (b), the photosensitive compound (c), and another additive were changed as shown in Table 2. The imidization rate, the sensitivity, the residual film rate, and the long-term reliability of the organic EL display apparatus were evaluated as described above using the obtained varnish.

Example 24

The long-term reliability of the organic EL display apparatus was evaluated using the varnish obtained in Example 2 in the same manner as in Example 2 except that the temperature at which the resin pattern was heat-treated was changed from 200° C. to 250° C.

Example 25

The long-term reliability of the organic EL display apparatus was evaluated using the varnish obtained in Example 2 in the same manner as in Example 2 except that the atmosphere in which the resin pattern was heat-treated was changed from a nitrogen atmosphere having an oxygen concentration of 0.01% to a nitrogen atmosphere having an oxygen concentration of 1%.

Example 26

The long-term reliability of the organic EL display apparatus was evaluated using the varnish obtained in Example 2 in the same manner as in Example 2 except that the atmosphere in which the resin pattern was heat-treated was changed from a nitrogen atmosphere having an oxygen concentration of 0.01% to a nitrogen atmosphere having an oxygen concentration of 5%.

Example 27

The long-term reliability of the organic EL display apparatus was evaluated using the varnish obtained in Example 2 in the same manner as in Example 2 except that the atmosphere in which the resin pattern was heat-treated was changed from a nitrogen atmosphere having an oxygen concentration of 0.01% to an air atmosphere having an oxygen concentration of 21%.

Example 28

To 30 g of GBL, 10.0 g of the polyimide precursor (α-2), 2.0 g of the phenol compound (b-1), 2.0 g of the quinone diazide compound (c-1), 2.5 g of 4,4',4''-methylidene trisphenol (e-1), 1.5 g of Valifast Red 1308 (d1-2-1), and 2.5 g of Oil Blue 613 (d1-3-1) were added to obtain a varnish of a positive photosensitive resin composition. The imidization rate, the sensitivity, the residual film rate, and the long-term reliability of the organic EL display apparatus were evaluated as described above using the obtained varnish. The resin pattern was heat-treated in an air atmosphere having an oxygen concentration of 21% at a temperature of 200° C.

Subsequently, a cured film having a film thickness of 1.0 μm and heat-treated at 200° C. was prepared on an alkali-free glass substrate in the same manner as in the item (1) Imidization Rate. The incident light intensity (I0) and the transmitted light intensity (I) of the prepared cured film were measured using a transmission densitometer (X-Rite 361T (V) manufactured by X-Rite Inc.). As an index of the light shielding property, the OD value was calculated using the following formula, and as a result, the OD value was 0.6.

OD value=$\log_{10}(I0/I)$

Example 29

The long-term reliability of the organic EL display apparatus was evaluated using the varnish obtained in Example 28 in the same manner as in Example 28 except that the temperature at which the resin pattern was heat-treated was changed from 200° C. to 250° C.

Subsequently, the OD value of the cured film was calculated in the same manner as in Example 28 except that the temperature of heat-treating was changed from 200° C. to 250° C. During the heat treatment, discoloration of the colorant partially proceeded, and as a result, the OD value was 0.3.

Comparative Example 8

To 30 g of GBL, 10.0 g of the polyimide precursor (a'-1) and 2.0 g of the quinone diazide compound (c-1) were added. To the resulting mixture, 1.0 g of TsOH was added to obtain a varnish of a positive photosensitive resin composition. The imidization rate, the sensitivity, the residual film rate, and the long-term reliability of the organic EL display apparatus were evaluated as described above using the obtained varnish.

Comparative Example 9

To 30 g of GBL, 10.0 g of the polyimide precursor (a'-1) and 2.0 g of the quinone diazide compound (c-1) were added. When 1.0 g of DBU was added to the resulting mixture, the varnish turned black, and a decomposition product of the quinone diazide compound was precipitated, and therefore the evaluation was stopped.

Comparative Example 16

The long-term reliability of the organic EL display apparatus was evaluated using the varnish obtained in Comparative Example 1 in the same manner as in Comparative Example 1 except that the temperature at which the resin pattern was heat-treated was changed from 200° C. to 250° C.

Comparative Example 17

The long-term reliability of the organic EL display apparatus was evaluated using the varnish obtained in Comparative Example 1 in the same manner as in Comparative Example 1 except that the atmosphere in which the resin pattern was heat-treated was changed from a nitrogen atmosphere having an oxygen concentration of 0.01% to a nitrogen atmosphere having an oxygen concentration of 1%.

Comparative Example 18

The long-term reliability of the organic EL display apparatus was evaluated using the varnish obtained in Comparative Example 1 in the same manner as in Comparative Example 1 except that the atmosphere in which the resin pattern was heat-treated was changed from a nitrogen atmosphere having an oxygen concentration of 0.01% to a nitrogen atmosphere having an oxygen concentration of 5%.

Comparative Example 19

The long-term reliability of the organic EL display apparatus was evaluated using the varnish obtained in Comparative Example 1 in the same manner as in Comparative Example 1 except that the atmosphere in which the resin pattern was heat-treated was changed from a nitrogen atmosphere having an oxygen concentration of 0.01% to an air atmosphere having an oxygen concentration of 21%.

Tables 2 to 5 show the compositions and evaluation results in Examples and Comparative Examples.

TABLE 1-1

| | | Amine component Diamine (molar ratio) | | | | | | | |
|---|---|---|---|---|---|---|---|---|---|
| | Resin | o-Tolidine Ip6.58 | DAE Ip6.78 | MDA Ip6.94 | TDE-R Ip7.08 | α Ip7.16 | BAHF Ip7.88 | SiDA 8.03 | Ratio of diamines having Ip <7.1 (mol %) |
| Synthesis Example 3 | a-1 | 20 | | | | | 65 | 5 | 22.2 |
| Synthesis Example 4 | a-2 | | 20 | | | | 65 | 5 | 22.2 |
| Synthesis Example 5 | a-3 | | | 20 | | | 65 | 5 | 22.2 |
| Synthesis Example 6 | a-4 | | | | 20 | | 65 | 5 | 22.2 |
| Synthesis Example 7 | a-5 | 10 | | | | | 75 | 5 | 11.1 |
| Synthesis Example 8 | a-6 | 5 | | | | | 80 | 5 | 5.6 |
| Synthesis Example 9 | a-7 | 30 | | | | | 55 | 5 | 33.3 |
| Synthesis Example 10 | a-8 | 40 | | | | | 45 | 5 | 44.4 |
| Synthesis Example 11 | a-9 | 50 | | | | | 35 | 5 | 55.6 |
| Synthesis Example 12 | a-10 | 10 | | 10 | | | 65 | 5 | 22.2 |
| Synthesis Example 13 | a-11 | 20 | | | | 65 | | 5 | 22.2 |
| Synthesis Example 14 | a-12 | 20 | | | | | 65 | 5 | 22.2 |
| Synthesis Example 15 | a-13 | 20 | | | | | 50 | 5 | 26.7 |
| Comparative Synthesis Example 1 | a'-1 | | | | | | 85 | 5 | 0 |
| Comparative Synthesis Example 2 | a'-2 | | | | | 85 | | 5 | 0 |
| Comparative Synthesis Example 3 | a'-3 | | | | | | 85 | 5 | 0 |

TABLE 1-2

| | | Amine component Monoamine (molar ratio) | Acid component Dianhydride (molar ratio) | |
|---|---|---|---|---|
| | Resin | MAP | ODPA | 6FDA |
| Synthesis Example 3 | a-1 | 20 | 100 | |
| Synthesis Example 4 | a-2 | 20 | 100 | |
| Synthesis Example 5 | a-3 | 20 | 100 | |
| Synthesis Example 6 | a-4 | 20 | 100 | |
| Synthesis Example 7 | a-5 | 20 | 100 | |
| Synthesis Example 8 | a-6 | 20 | 100 | |
| Synthesis Example 9 | a-7 | 20 | 100 | |
| Synthesis Example 10 | a-8 | 20 | 100 | |
| Synthesis Example 11 | a-9 | 20 | 100 | |
| Synthesis Example 12 | a-10 | 20 | 100 | |
| Synthesis Example 13 | a-11 | 20 | 100 | |
| Synthesis Example 14 | a-12 | 20 | | 100 |
| Synthesis Example 15 | a-13 | 50 | | |
| Comparative Synthesis Example 1 | a'-1 | 20 | 100 | |
| Comparative Synthesis Example 2 | a'-2 | 20 | 100 | |
| Comparative Synthesis Example 3 | a'-3 | 20 | | 100 |

TABLE 2-1

| | Resin (a) (Kind) (Blending amount) | Phenol compound (b) (Kind) (Blending amount) | Photo-sensitive compound (c) (Kind) (Blending amount) | Other (Kind) (Blending amount) | Solvent (Kind) (Blending amount) |
|---|---|---|---|---|---|
| Example 1 | a-1 10.0 g | b-1 2.0 g | c-1 2.0 g | — | GBL 30 g |
| Example 2 | a-2 10.0 g | b-1 2.0 g | c-1 2.0 g | — | GBL 30 g |
| Example 3 | a-3 10.0 g | b-1 2.0 g | c-1 2.0 g | — | GBL 30 g |
| Example 4 | a-4 10.0 g | b-1 2.0 g | c-1 2.0 g | — | GBL 30 g |
| Example 5 | a-5 10.0 g | b-1 2.0 g | c-1 2.0 g | — | GBL 30 g |
| Example 6 | a-6 10.0 g | b-1 2.0 g | c-1 2.0 g | — | GBL 30 g |

TABLE 2-1-continued

| | Resin (a) (Kind) (Blending amount) | Phenol compound (b) (Kind) (Blending amount) | Photo-sensitive compound (c) (Kind) (Blending amount) | Other (Kind) (Blending amount) | Solvent (Kind) (Blending amount) |
|---|---|---|---|---|---|
| Example 7 | a-7 10.0 g | b-1 2.0 g | c-1 2.0 g | — | GBL 30 g |
| Example 8 | a-8 10.0 g | b-1 2.0 g | c-1 2.0 g | — | GBL 30 g |
| Example 9 | a-9 10.0 g | b-1 2.0 g | c-1 2.0 g | — | GBL 30 g |
| Example 10 | a-10 10.0 g | b-1 2.0 g | c-1 2.0 g | — | GBL 30 g |
| Example 11 | a-11 10.0 g | b-1 2.0 g | c-1 2.0 g | — | GBL 30 g |
| Example 12 | a-12 10.0 g | b-1 2.0 g | c-1 2.0 g | — | GBL 30 g |
| Example 13 | a-13 10.0 g | b-1 2.0 g | c-1 2.0 g | — | GBL 30 g |
| Example 14 | a-2 10.0 g | b-2 2.0 g | c-1 2.0 g | — | GBL 30 g |
| Example 15 | a-2 10.0 g | b-3 2.0 g | c-1 2.0 g | — | GBL 30 g |

TABLE 2-2

| | Resin (a) (Kind) (Blending amount) | Phenol compound (b) (Kind) (Blending amount) | Photosensitive compound (c) (Kind) (Blending amount) | Other (Kind) (Blending amount) | Solvent (Kind) (Blending amount) |
|---|---|---|---|---|---|
| Example 16 | a-2 10.0 g | b-4 2.0 g | c-1 2.0 | — | GBL 30 g |
| Example 17 | a-2 10.0 g | b-5 2.0 g | c-1 2.0 g | — | GBL 30 g |
| Example 18 | a-2 10.0 g | b-1 1.0 g | c-1 2.0 g | — | GBL 30 g |
| Example 19 | a-2 10.0 g | b-1 0.5 g | c-1 2.0 g | — | GBL 30 g |
| Example 20 | a-2 10.0 g | b-1 3.0 g | c-1 2.0 g | — | GBL 30 g |
| Example 21 | a-2 10.0 g | b-1 5.0 g | c-1 2.0 g | — | GBL 30 g |
| Example 22 | a-2 10.0 g | b-1 2.0 g | c-1 2.0 g | HMOM-TPHAP 2.0 g | GBL 30 g |
| Example 23 | a-2 10.0 g | b-1 2.0 g | c-1 2.0 g | VG3101L 2.0 g | GBL 30 g |
| Example 24 | a-2 10.0 g | b-1 2.0 g | c-1 2.0 g | — | GBL 30 g |
| Example 25 | a-2 10.0 g | b-1 2.0 g | c-1 2.0 g | — | GBL 30 g |
| Example 26 | a-2 10.0 g | b-1 2.0 g | c-1 2.0 g | — | GBL 30 g |
| Example 27 | a-2 10.0 g | b-1 2.0 g | c-1 2.0 g | — | GBL 30 g |
| Example 28 | a-2 10.0 g | b-1 2.0 g | c-1 2.0 g | e-1/d1-2-1/d1-3-1 2.5 g/1.5 g/2.5 g | GBL 30 g |
| Example 29 | a-2 10.0 g | b-1 2.0 g | c-1 2.0 g | e-1/d1-2-1/d1-3-1 2.5 g/1.5 g/2.5 g | GBL 30 g |

TABLE 3

| | Resin (a) (Kind) (Blending amount) | Phenol compound (b) (Kind) (Blending amount) | Photo-sensitive compound (c) (Kind) (Blending amount) | Other (Kind) (Blending amount) | Solvent (Kind) (Blending amount) |
|---|---|---|---|---|---|
| Comparative Example 1 | a'-1 10.0 g | — | c-1 2.0 g | — | GBL 30 g |
| Comparative Example 2 | a'-2 10.0 g | — | c-1 2.0 g | — | GBL 30 g |
| Comparative Example 3 | a'-3 10.0 g | — | c-1 2.0 g | — | GBL 30 g |
| Comparative | a-1 | — | c-1 | — | GBL |

TABLE 3-continued

| | Resin (a) (Kind) (Blending amount) | Phenol compound (b) (Kind) (Blending amount) | Photosensitive compound (c) (Kind) (Blending amount) | Other (Kind) (Blending amount) | Solvent (Kind) (Blending amount) |
|---|---|---|---|---|---|
| Example 4 | 10.0 g | — | 2.0 g | — | 30 g |
| Comparative | a-2 | — | c-1 | — | GBL |
| Example 5 | 10.0 g | — | 2.0 g | — | 30 g |
| Comparative | a-3 | — | c-1 | — | GBL |
| Example 6 | 10.0 g | — | 2.0 g | — | 30 g |
| Comparative | a-4 | — | c-1 | — | GBL |
| Example 7 | 10.0 g | — | 2.0 g | — | 30 g |
| Comparative | a'-1 | — | c-1 | TsOH | GBL |
| Example 8 | 10.0 g | — | 2.0 g | 1.0 g | 30 g |
| Comparative | a'-1 | — | c-1 | DBU | GBL |
| Example 9 | 10.0 g | — | 2.0 g | 1.0 g | 30 g |
| Comparative | a'-1 | b'-1 | c-1 | — | GBL |
| Example 10 | 10.0 g | 2.0 g | 2.0 g | — | 30 g |
| Comparative | a'-1 | b'-2 | c-1 | — | GBL |
| Example 11 | 10.0 g | 2.0 g | 2.0 g | — | 30 g |
| Comparative | a'-1 | b-1 | c-1 | — | GBL |
| Example 12 | 10.0 g | 2.0 g | 2.0 g | — | 30 g |
| Comparative | a'-1 | b-2 | c-1 | — | GBL |
| Example 13 | 10.0 g | 2.0 g | 2.0 g | — | 30 g |
| Comparative | a-2 | b'-1 | c-1 | — | GBL |
| Example 14 | 10.0 g | 2.0 g | 2.0 g | — | 30 g |
| Comparative | a-2 | b'-2 | c-1 | — | GBL |
| Example 15 | 10.0 g | 2.0 g | 2.0 g | — | 30 g |
| Comparative | a'-1 | — | c-1 | — | GBL |
| Example 16 | 10.0 g | — | 2.0 g | — | 30 g |
| Comparative | a'-1 | — | c-1 | — | GBL |
| Example 17 | 10.0 g | — | 2.0 g | — | 30 g |
| Comparative | a'-1 | — | c-1 | — | GBL |
| Example 18 | 10.0 g | — | 2.0 g | — | 30 g |
| Comparative | a'-1 | — | c-1 | — | GBL |
| Example 19 | 10.0 g | — | 2.0 g | — | 30 g |

TABLE 4-1

| | Imidization rate (%) | | | Sensitivity | | Residual film rate | |
|---|---|---|---|---|---|---|---|
| | Prebaked film | Cured film at 200° C. | Judgment | (mJ/cm$^2$) | Judgment | (%) | Judgment |
| Example 1 | 15 | 97 | A | 160 | A | 87 | A |
| Example 2 | 15 | 95 | A | 135 | S | 84 | A |
| Example 3 | 15 | 93 | A | 160 | A | 86 | A |
| Example 4 | 15 | 93 | A | 135 | S | 86 | A |
| Example 5 | 14 | 89 | B | 130 | S | 82 | A |
| Example 6 | 13 | 80 | B | 130 | S | 80 | A |
| Example 7 | 15 | 97 | A | 150 | A | 85 | A |
| Example 8 | 16 | 99 | A | 170 | A | 87 | A |
| Example 9 | 18 | 99 | A | 200 | B | 90 | A |
| Example 10 | 15 | 94 | A | 135 | S | 84 | A |
| Example 11 | 15 | 95 | A | 130 | S | 85 | A |
| Example 12 | 15 | 96 | A | 125 | S | 84 | A |
| Example 13 | 15 | 95 | A | 130 | S | 80 | A |
| Example 14 | 15 | 97 | A | 135 | S | 80 | A |
| Example 15 | 15 | 80 | B | 155 | A | 84 | A |

| | Conditions of heat-treating for long-term reliability | | Pixel light-emitting area ratio for long-term reliability [%] | | | | |
|---|---|---|---|---|---|---|---|
| | Temperature [° C.] | Oxygen concentration [%] | 0 hr | 250 hr | 500 hr | 1000 hr | Judgment |
| Example 1 | 200 | 0.01 | 100 | 100 | 90 | 82 | S |
| Example 2 | 200 | 0.01 | 100 | 100 | 90 | 82 | S |
| Example 3 | 200 | 0.01 | 100 | 98 | 88 | 78 | A |
| Example 4 | 200 | 0.01 | 100 | 98 | 88 | 78 | A |
| Example 5 | 200 | 0.01 | 100 | 96 | 86 | 72 | A |
| Example 6 | 200 | 0.01 | 100 | 94 | 78 | 66 | B |
| Example 7 | 200 | 0.01 | 100 | 100 | 90 | 82 | S |
| Example 8 | 200 | 0.01 | 100 | 100 | 94 | 84 | S |
| Example 9 | 200 | 0.01 | 100 | 100 | 98 | 88 | S |
| Example 10 | 200 | 0.01 | 100 | 100 | 90 | 82 | S |
| Example 11 | 200 | 0.01 | 100 | 100 | 90 | 82 | S |
| Example 12 | 200 | 0.01 | 100 | 100 | 90 | 82 | S |
| Example 13 | 200 | 0.01 | 100 | 100 | 90 | 82 | S |
| Example 14 | 200 | 0.01 | 100 | 100 | 92 | 85 | S |
| Example 15 | 200 | 0.01 | 100 | 96 | 84 | 70 | A |

TABLE 4-2

| | Imidization rate (%) | | | Sensitivity | | Residual film rate | |
|---|---|---|---|---|---|---|---|
| | Prebaked film | Cured film at 200° C. | Judgment | (mJ/cm$^2$) | Judgment | (%) | Judgment |
| Example 16 | 14 | 86 | B | 160 | A | 86 | A |
| Example 17 | 14 | 78 | B | 160 | A | 86 | A |
| Example 18 | 15 | 90 | A | 145 | S | 90 | A |
| Example 19 | 13 | 80 | B | 170 | A | 93 | A |
| Example 20 | 15 | 97 | A | 125 | S | 79 | B |
| Example 21 | 16 | 99 | A | 110 | S | 65 | B |
| Example 22 | 15 | 97 | A | 135 | S | 82 | A |
| Example 23 | 15 | 90 | A | 145 | S | 86 | A |
| Example 24 | — | — | — | — | — | — | — |
| Example 25 | — | — | — | — | — | — | — |
| Example 26 | — | — | — | — | — | — | — |
| Example 27 | — | — | — | — | — | — | — |
| Example 28 | 15 | 95 | A | 200 | B | 65 | B |
| Example 29 | — | — | — | — | — | — | — |

| | Conditions of heat-treating for long-term reliability | | Pixel light-emitting area ratio for long-term reliability [%] | | | | |
|---|---|---|---|---|---|---|---|
| | Temperature [° C.] | Oxygen concentration [%] | 0 hr | 250 hr | 500 hr | 1000 hr | Judgment |
| Example 16 | 200 | 0.01 | 100 | 94 | 78 | 64 | B |
| Example 17 | 200 | 0.01 | 100 | 92 | 76 | 60 | B |
| Example 18 | 200 | 0.01 | 100 | 96 | 86 | 74 | A |
| Example 19 | 200 | 0.01 | 100 | 94 | 78 | 66 | B |
| Example 20 | 200 | 0.01 | 100 | 100 | 90 | 82 | S |
| Example 21 | 200 | 0.01 | 100 | 100 | 92 | 84 | S |
| Example 22 | 200 | 0.01 | 100 | 100 | 96 | 88 | S |
| Example 23 | 200 | 0.01 | 100 | 98 | 86 | 76 | A |
| Example 24 | 250 | 0.01 | 100 | 100 | 98 | 92 | S |
| Example 25 | 200 | 1 | 100 | 98 | 88 | 78 | A |
| Example 26 | 200 | 5 | 100 | 96 | 84 | 70 | A |
| Example 27 | 200 | 21 (Air atmosphere) | 100 | 94 | 78 | 64 | B |
| Example 28 | 200 | 21 (Air atmosphere) | 100 | 92 | 76 | 60 | B |
| Example 29 | 250 | 21 (Air atmosphere) | 100 | 94 | 78 | 64 | B |

TABLE 5-1

| | Imidization rate (%) | | | Sensitivity | | Residual film rate | |
|---|---|---|---|---|---|---|---|
| | Prebaked film | Cured film at 200° C. | Judgment | (mJ/cm$^2$) | Judgment | (%) | Judgment |
| Comparative Example 1 | 5 | 54 | C | 170 | A | 90 | A |
| Comparative Example 2 | 5 | 53 | C | 160 | A | 91 | A |
| Comparative Example 3 | 5 | 56 | C | 150 | A | 85 | A |
| Comparative Example 4 | 8 | 67 | C | 190 | A | 94 | A |
| Comparative Example 5 | 8 | 65 | C | 170 | A | 92 | A |
| Comparative Example 6 | 8 | 64 | C | 180 | A | 93 | A |
| Comparative Example 7 | 8 | 64 | C | 170 | A | 93 | A |
| Comparative Example 8 | 46 | 97 | C | 290 | C | 96 | A |
| Comparative Example 9 | — | — | — | — | — | — | — |
| Comparative Example 10 | 10 | 59 | C | 145 | S | 77 | B |

TABLE 5-1-continued

| | Conditions of heat-treating for long-term reliability | | Pixel light-emitting area ratio for long-term reliability [%] | | | | |
|---|---|---|---|---|---|---|---|
| | Temperature [° C.] | Oxygen concentration [%] | 0 hr | 250 hr | 500 hr | 1000 hr | Judgment |
| Comparative Example 1 | 200 | 0.01 | 100 | 82 | 50 | 22 | C |
| Comparative Example 2 | 200 | 0.01 | 100 | 82 | 50 | 22 | C |
| Comparative Example 3 | 200 | 0.01 | 100 | 82 | 50 | 22 | C |
| Comparative Example 4 | 200 | 0.01 | 100 | 84 | 56 | 28 | C |
| Comparative Example 5 | 200 | 0.01 | 100 | 84 | 56 | 28 | C |
| Comparative Example 6 | 200 | 0.01 | 100 | 84 | 54 | 24 | C |
| Comparative Example 7 | 200 | 0.01 | 100 | 84 | 54 | 24 | C |
| Comparative Example 8 | 200 | 0.01 | 100 | 92 | 74 | 58 | C |
| Comparative Example 9 | — | — | — | — | — | — | — |
| Comparative Example 10 | 200 | 0.01 | 100 | 84 | 56 | 28 | C |

TABLE 5-2

| | Imidization rate (%) | | | Sensitivity | | Residual film rate | |
|---|---|---|---|---|---|---|---|
| | Prebaked film | Cured film at 200° C. | Judgment | (mJ/cm$^2$) | Judgment | (%) | Judgment |
| Comparative Example 11 | 8 | 56 | C | 155 | A | 80 | A |
| Comparative Example 12 | 12 | 70 | C | 125 | S | 78 | B |
| Comparative Example 13 | 12 | 72 | C | 125 | S | 73 | B |
| Comparative Example 14 | 12 | 70 | C | 155 | A | 82 | A |
| Comparative Example 15 | 12 | 67 | C | 170 | A | 83 | A |
| Comparative Example 16 | — | — | — | — | — | — | — |
| Comparative Example 17 | — | — | — | — | — | — | — |
| Comparative Example 18 | — | — | — | — | — | — | — |
| Comparative Example 19 | — | — | — | — | — | — | — |

| | Conditions of heat-treating for long-term reliability | | Pixel light-emitting area ratio for long-term reliability [%] | | | | |
|---|---|---|---|---|---|---|---|
| | Temperature [° C.] | Oxygen concentration [%] | 0 hr | 250 hr | 500 hr | 1000 hr | Judgment |
| Comparative Example 11 | 200 | 0.01 | 100 | 84 | 54 | 24 | C |
| Comparative Example 12 | 200 | 0.01 | 100 | 92 | 72 | 54 | C |
| Comparative Example 13 | 200 | 0.01 | 100 | 92 | 74 | 58 | C |
| Comparative Example 14 | 200 | 0.01 | 100 | 86 | 60 | 36 | C |
| Comparative Example 15 | 200 | 0.01 | 100 | 84 | 58 | 30 | C |
| Comparative | 250 | 0.01 | 100 | 98 | 88 | 78 | A |

TABLE 5-2-continued

| Example | | | | | | | |
|---|---|---|---|---|---|---|---|
| Example 16 | | | | | | | |
| Comparative Example 17 | 200 | 1 | 100 | 80 | 48 | 18 | C |
| Comparative Example 18 | 200 | 5 | 100 | 76 | 42 | 10 | C |
| Comparative Example 19 | 200 | 21 (Air atmosphere) | 100 | 68 | 30 | 0 | C |

DESCRIPTION OF REFERENCE SIGNS

1: TFT (thin film transistor)
2: Wiring
3: TFT insulation layer
4: Planarization layer
5: ITO (transparent electrode)
6: Substrate
7: Contact hole
8: Insulation layer
9: Silicon wafer
10: Al pad
11: Passivation layer
12: Insulation layer
13: Metal (Cr, Ti, or the like) layer
14: Metal wiring (Al, Cu, or the like)
15: Insulation layer
16: Barrier metal
17: Scribe line
18: Solder bump
19: Alkali-free glass substrate
20: First electrode (transparent electrode)
21: Auxiliary electrode
22: Insulation layer
23: Organic EL layer
24: Second electrode (non-transparent electrode)

The invention claimed is:

1. A photosensitive resin composition comprising:
a polyimide precursor (a), the polyimide precursor (a) having a residue derived from a diamine having an ionization potential of less than 7.1 eV;
a phenol compound (b) having an electron withdrawing group; and
a photosensitive compound (c).

2. The photosensitive resin composition according to claim 1, wherein the residue derived from the diamine having an ionization potential of less than 7.1 eV is included at a content of 5 to 50 mol % based on 100 mol % of diamine residues included in the polyimide precursor (a).

3. The photosensitive resin composition according to claim 1, wherein the residue derived from the diamine having an ionization potential of less than 7.1 eV has an ether bond.

4. The photosensitive resin composition according to claim 1, wherein the diamine having an ionization potential of less than 7.1 eV includes one or more diamines selected from the group consisting of 4,4'-diaminodiphenyl ether, 1,4-bis(4-aminophenoxy)benzene, 2,2-bis[4-(4-aminophenoxy)phenyl]propane, and 1,3-bis(4-aminophenoxy)benzene.

5. The photosensitive resin composition according to claim 1, wherein the phenol compound (b) having an electron withdrawing group is included at a content of 1 to 50 parts by mass based on 100 parts by mass of the polyimide precursor (a).

6. The photosensitive resin composition according to claim 1, wherein the phenol compound (b) having an electron withdrawing group includes a compound (b1) having a phenolic hydroxyl group having a pKa of 11.0 or less.

7. The photosensitive resin composition according to claim 1, wherein the phenol compound (b) having an electron withdrawing group includes a compound (b2) represented by General Formula (1):

[Chem. 1]

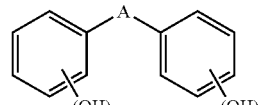

(1)

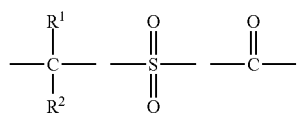

(2)

wherein A represents a divalent group selected from the group consisting of structures represented by General Formula (2), a and b each independently represent an integer of 0 to 3, a+b is an integer of 2 to 4, $R^1$ and $R^2$ in General Formula (2) each independently represent a halogen atom or a monovalent organic group having 1 to 20 carbon atoms, the monovalent organic group substituted with a halogen atom.

8. The photosensitive resin composition according to claim 1, further comprising a colorant (d).

9. A photosensitive resin sheet comprising the photosensitive resin composition according to claim 1.

10. A cured film comprising the photosensitive resin composition according to claim 1 that is cured.

11. A method for producing a cured film, the method comprising the steps of:
forming a photosensitive resin film including the photosensitive resin composition according to claim 1 on a substrate;
exposing the photosensitive resin film;
developing the photosensitive resin film that is exposed; and
heat-treating, at 200° C. or lower, the photosensitive resin film that is developed.

12. A method for producing a cured film, the method comprising the steps of:
forming a photosensitive resin film including the photosensitive resin composition according to claim 1 on a substrate;
exposing the photosensitive resin film;
developing the photosensitive resin film that is exposed; and
heat-treating, in an atmosphere having an oxygen concentration of 1% or more, the photosensitive resin film that is developed.

13. An organic electroluminescence (EL) display apparatus comprising:
- a substrate;
- a drive circuit;
- a planarization layer;
- a first electrode;
- an insulation layer;
- a light-emitting layer; and
- a second electrode, wherein the drive circuit, the planarization layer, the first electrode, the insulation layer, the light-emitting layer, and the second electrode are placed over the substrate, and the planarization layer and/or the insulation layer includes the cured film according to claim 10.

14. The organic EL display apparatus according to claim 13, wherein the planarization layer includes 2 to 5 layers.

15. An electronic component comprising:
- a substrate;
- an electrode;
- a metal wiring; and
- an interlayer insulation layer and/or a surface protective layer, wherein the electrode, the metal wiring, and the interlayer insulation layer and/or the surface protective layer are placed over the substrate, and the interlayer insulation layer and/or the surface protective layer at least partially includes the cured film according to claim 10.

* * * * *